United States Patent
Shibata et al.

(10) Patent No.: US 7,642,601 B2
(45) Date of Patent: Jan. 5, 2010

(54) METHOD OF DESIGNING SEMICONDUCTOR INTEGRATED CIRCUIT DEVICE AND SEMICONDUCTOR INTEGRATED CIRCUIT DEVICE

(75) Inventors: Ryuji Shibata, Higashiyamato (JP); Shigeru Shimada, Hoya (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/467,370

(22) Filed: May 18, 2009

(65) Prior Publication Data

US 2009/0218626 A1 Sep. 3, 2009

Related U.S. Application Data

(60) Continuation of application No. 11/167,648, filed on Jun. 28, 2005, now Pat. No. 7,541,647, which is a continuation of application No. 10/440,162, filed on May 19, 2003, now Pat. No. 6,912,697, which is a continuation of application No. 09/939,699, filed on Aug. 28, 2001, now Pat. No. 6,611,943, which is a division of application No. 09/131,393, filed on Aug. 7, 1998, now Pat. No. 6,340,825.

(30) Foreign Application Priority Data

Aug. 21, 1997 (JP) ............................ 1997-224560
Dec. 9, 1997 (JP) ............................ 1997-338337

(51) Int. Cl.
*H01L 23/62* (2006.01)

(52) U.S. Cl. ............................... 257/357; 257/E27.013

(58) Field of Classification Search ............... 257/357, 257/E27.013
See application file for complete search history.

(56) References Cited

U.S. PATENT DOCUMENTS 4,851,364 A 7/1989 Yatsuda et al.
(Continued)

FOREIGN PATENT DOCUMENTS

GB 2269049 1/1994
(Continued)

OTHER PUBLICATIONS

Kuroda et al., "A 0.9V 150MHz 10mW 4mm$^2$ 2-D Discrete Cosine Transform Core Processor With Variable Threshold Voltage Scheme",1996 ISSCC96.
(Continued)

*Primary Examiner*—Wai-Sing Louie
*Assistant Examiner*—Bilkis Jahan
(74) *Attorney, Agent, or Firm*—Antonelli, Terry, Stout & Kraus, LLP.

(57) ABSTRACT

In a semiconductor integrated circuit device and a method of designing the same, design information about circuit cells each having a desired function are described as objects according to selected purposes. The pieces of design information are registered in a cell library as cell information capable of forming any of substrate potential fixed cells and substrate potential variable cells. Further, a data sheet common to the substrate potential fixed cell and the substrate potential variable cell is offered to a user, so that the user is able to make a selection according to the user's purposes. The substrate potential fixed cells and the substrate potential variable cells are mixed together on a semiconductor chip so as to be properly used according to the functions or the like of circuit portions in which the cells are used.

14 Claims, 20 Drawing Sheets

U.S. PATENT DOCUMENTS

| | | | |
|---|---|---|---|
| 4,910,162 A * | 3/1990 | Yasaka et al. | 438/129 |
| 5,105,252 A | 4/1992 | Kim | |
| 5,239,197 A | 8/1993 | Yamamoto | |
| 5,311,048 A | 5/1994 | Takahashi | |
| 5,376,839 A | 12/1994 | Horiguchi | |
| 5,434,436 A | 7/1995 | Tamiguchi | |
| 5,445,987 A * | 8/1995 | Kuroda et al. | 438/257 |
| 5,461,338 A | 10/1995 | Hirayama et al. | |
| 5,536,955 A | 7/1996 | Ali | |
| 5,610,533 A | 3/1997 | Arimoto et al. | |
| 5,619,420 A | 4/1997 | Breid | |
| 5,663,662 A | 9/1997 | Kurosawa | |
| 5,703,522 A | 12/1997 | Arimoto et al. | |
| 5,763,907 A | 6/1998 | Dallavalle et al. | |
| 5,801,407 A | 9/1998 | Yamada | |
| 5,854,461 A | 12/1998 | Sorenson | |
| 5,898,595 A | 4/1999 | Bair et al. | |
| 6,055,655 A | 4/2000 | Momohara | |
| 6,232,793 B1 | 5/2001 | Arimoto et al. | |
| 6,462,978 B2 | 10/2002 | Shibata et al. | |

FOREIGN PATENT DOCUMENTS

| | | |
|---|---|---|
| JP | 60-130138 | 4/1985 |
| JP | 63-090847 | 4/1988 |
| JP | 05-108194 | 4/1993 |
| JP | 06-21443 | 1/1994 |
| JP | 60-085200 | 3/1994 |
| JP | 6-120439 | 4/1994 |
| JP | 06-188312 | 7/1994 |
| JP | 6-334010 | 12/1994 |
| JP | 07-007081 | 1/1995 |
| JP | 7-235608 | 9/1995 |
| JP | 60-017183 | 1/1996 |
| JP | 09-36246 | 2/1997 |
| JP | 09-081625 | 3/1997 |
| WO | WO 97/21247 | 6/1997 |

OTHER PUBLICATIONS

Kuroda et al., "A High-Speed Low-Power 0.3μm CMOS Gate Array With Variable Threshold Voltage (VT) Scheme", IEEE 1996 Custom Integrated Circuits Conference.

Murry, W., "Chapter 5: CMOS Technology", Zusetsu Cho Eruesuai Koqaku (illustrated ULSI Engineering in English), pp. 167-191 (in Japanese with English translation).

* cited by examiner

OBJECT CP

OBJECT DWL

OBJECT CN

OBJECT DTH

OBJECT E

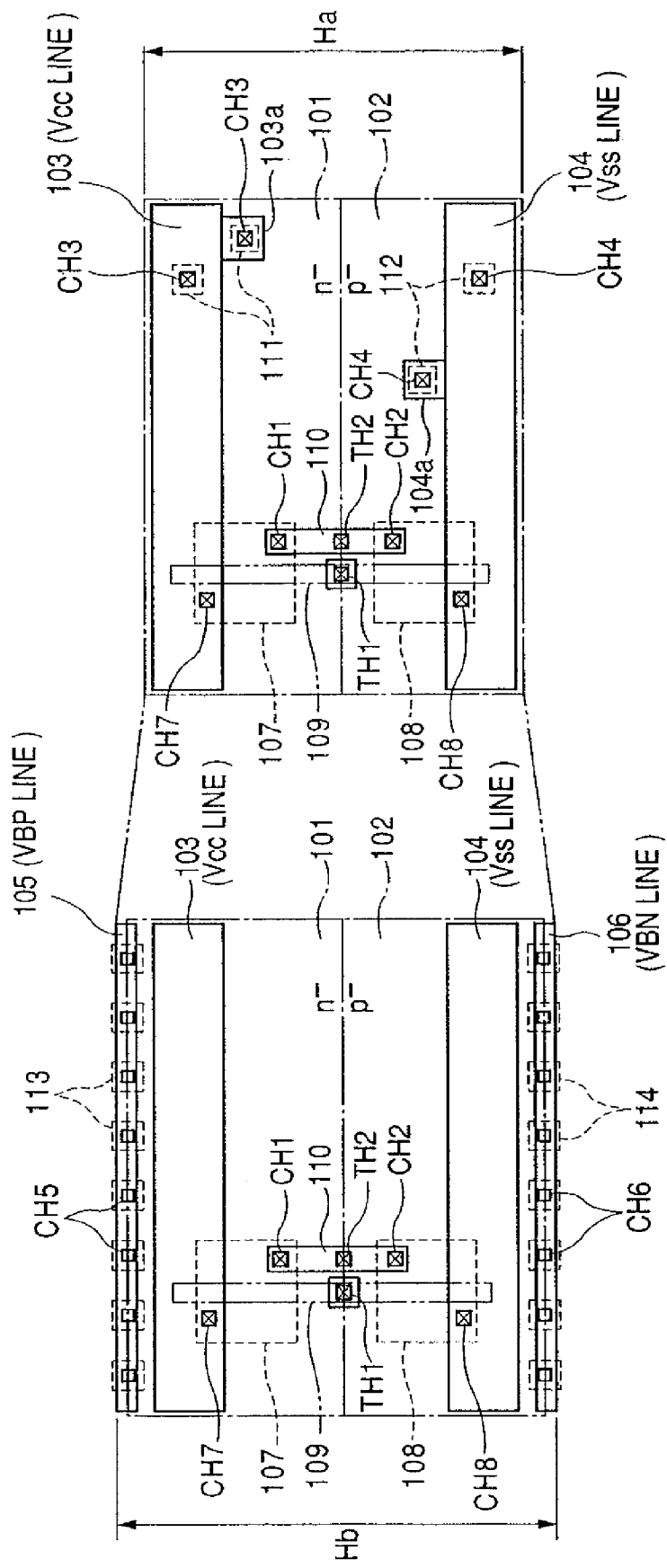

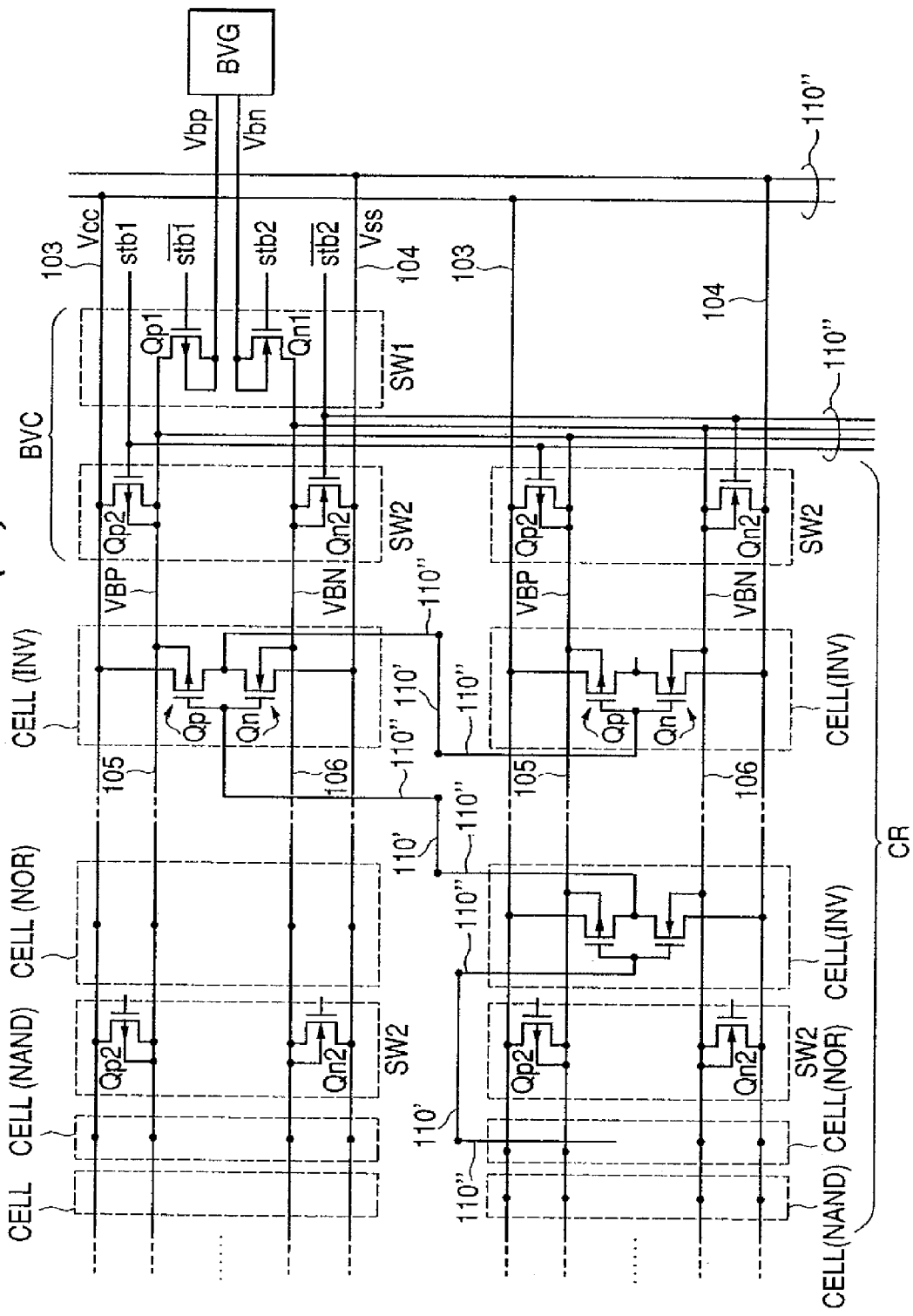

OBJECT BM

OBJECT CM

OBJECT AM

OBJECT EM

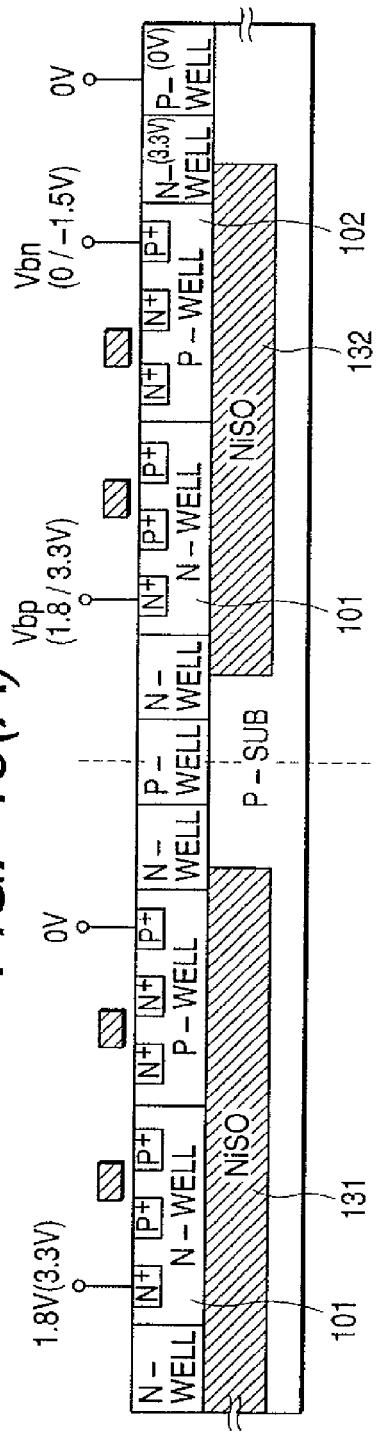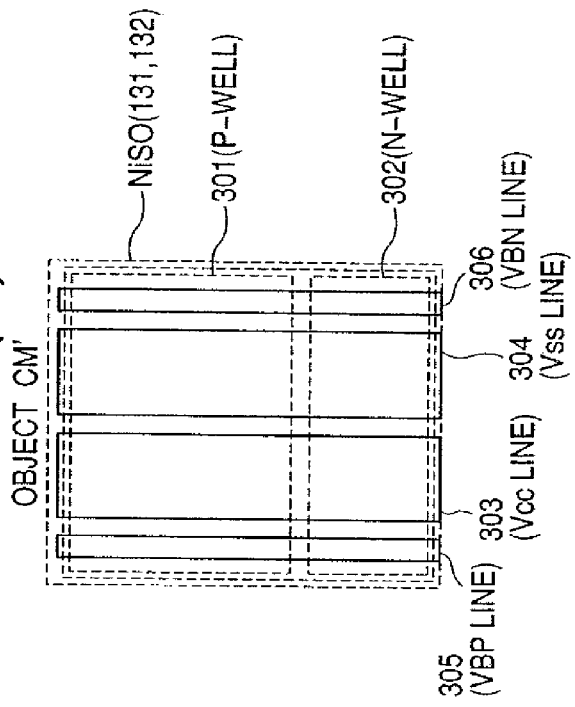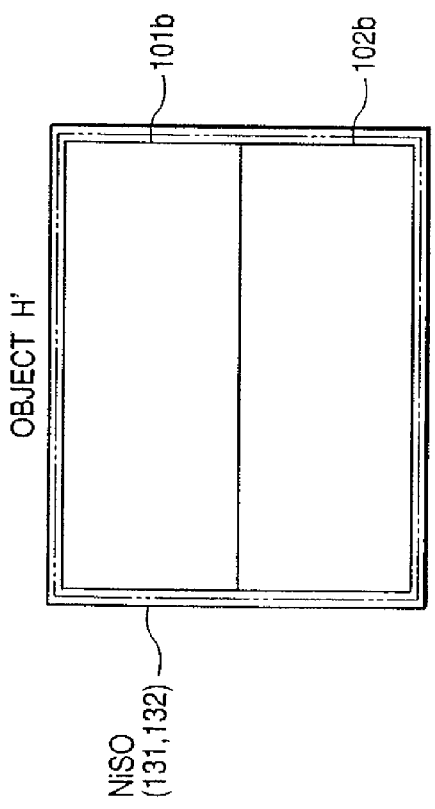
FIG. 19(A)
FIG. 19(B)
FIG. 19(C)

METHOD OF DESIGNING SEMICONDUCTOR INTEGRATED CIRCUIT DEVICE AND SEMICONDUCTOR INTEGRATED CIRCUIT DEVICE

This application is a continuation of U.S. application Ser. No. 11/167,648, filed Jun. 28, 2005, now U.S. Pat. No. 7,541,647 which, in turn, is a continuation of U.S. application Ser. No. 10/440,162, filed May 19, 2003, now U.S. Pat. No. 6,912,697 which, in turn, is a continuation of U.S. application Ser. No. 09/939,699, filed Aug. 28, 2001 (now U.S. Pat. No. 6,611,943), and which, in turn, is a divisional of U.S. application Ser. No. 09/131,393, filed Aug. 7, 1998 (now U.S. Pat. No. 6,340,825); and the entire disclosures of all of which are hereby incorporated by reference.

This invention relates to a method of designing a semiconductor integrated circuit device, and a technique effective in a case in which a plurality of circuits different in characteristic from each other are prepared as a cell library and a user selects a desired circuit from the cell library in the course of design of a semiconductor integrated circuit device. This invention also relates to a technique which is effective for use in the design of an ASIC (Application Specific Integrated Circuit), for example.

It has been known that a semiconductor logic integrated circuit device principally using field effect transistors like MOSFETs (Metal-Oxide-Semiconductor Field Effect Transistors) is capable of operating at high speed as the threshold voltage of each MOSFET decreases; whereas, since a substantial leakage current is produced during its off state when the threshold voltage thereof is low, the use of a semiconductor logic integrated circuit device will lead to an increase in power consumption. As a characteristic of each MOSFET, a so-called substrate bias effect is known, wherein the threshold voltage thereof will go high as a reverse bias voltage between the source thereof and a base (substrate or well region) increases. Further, a technique for controlling a standby current has been described in Japanese Published Unexamined Patent Application No. Hei 7-235608, for example.

SUMMARY OF THE INVENTION

A technique, wherein an inverter circuit or an inverter INV, capable of switching the potentials of bases (n well and p well) to a source voltage Vcc and a reference voltage Vss, and base or substrate bias voltages Vbp (Vbp>Vcc) and Vbn (Vbn>Vcc), as shown in FIGS. 21(A) and 21(B), is used in place of an inverter INV wherein the potentials of bases (n well and p well) shown in FIGS. 20(A) and 20(E) are fixed to a source voltage Vcc and a reference voltage Vss (Vcc>Vss), respectively, has been described in, for example, "ISSCC Dig. of Tech. Papers", pp. 166-167, 437, February 1996, or IEEE CICC, pp. 53-56, May 1996.

According to this technique, the source voltages Vcc and Vss are applied to the bases (n well and p well) when the circuit is in operation (active), to thereby supply a low reverse bias voltage between the source and substrate or base, whereby each MOSFET is set to a low threshold so as to operate the circuit device at high speed. On the other hand, when the circuit is deactivated (at standby), the substrate bias voltages Vbp and Vbn are applied to the bases (n well and p well) to, supply a high reverse bias voltage between the source and the base (well), thereby increasing the threshold of each MOSFET to reduce the leakage current, whereby low power consumption is provided. The present inventors have discussed the semiconductor integrated circuit device using MOSFETs capable of performing switching to the substrate bias voltages. As a result, it became evident that the following problems were inherent in such a device.

When the threshold of each MOSFET is controlled using the above described substrate bias effect in an attempt to realize an IC having desired characteristics, an inconvenience occurs in that wiring or wires for supplying the bias voltages to the well regions used as the bases of the respective MOSFETs are required in large numbers (Vcc line, VbpNcc line, Vss line and VbnNss line) and the area occupied by the circuit, and, in turn, the chip size of the IC, increases.

The development of an ASIC or the like will call for consideration of two cases: a first case where a user desires an IC having low power consumption or reduced chip size even if its operating speed is slow; and a second case where the user desires an IC capable of operating at high speed even if the power consumption increases more or less. When the reverse bias voltage between the source and base (well) is increased or decreased in an attempt to realize the above-described ICs which are different in characteristic from each other, a maker must separately design substrate potential fixed circuit cells and substrate potential variable circuit cells suitable for the respective ICs and prepare them as separate cell libraries. Therefore, the design effort increases, and the labor, such as the extraction of characteristics including delay times or the like of the circuit cells, required when the user designs and evaluates the chip using these circuit cells, the description thereof in the specifications (data sheet or data book), etc. also increases, i.e., the burden of preparing respective specifications for corresponding cell libraries increases.

An object of the present invention is to provide a design technique capable of implementing ICs which are different in cell type from each other without having to increase the burden on the designer.

Another object of the present invention is to provide a design technique capable of easily implementing a semiconductor integrated circuit device in which its chip size, power consumption and operating speed are optimized.

The above, other objects and novel features of this invention will become apparent from the description provided by the present specification and the accompanying drawings.

A summary of a typical one of the features disclosed in the present application will be described as follows:

Design information about circuit cells each having a desired function are described as objects according to desired purposes and are registered in a cell library registered with a plurality of circuit cells for forming ASIC or the like as design resources in the form of cell information capable of forming any of substrate potential fixed and variable cells by only the deletion or addition of information about predetermined objects. Incidentally, the present cell library is stored in a storage medium such as a magnetic disc, an optical disk, a printed material or the like.

As a typical one of the above-described circuit cells, a cell is known which comprises a pair consisting of a p channel MOSFET and an n channel MOSFET constituting a CMOS inverter which falls under the designation of a minimum unit in a circuit, for example. Others used as the circuit cells registered in the cell library may include a basic circuit cell, such as a flip-flop, a NOR gate, a NAND gate or the like, as frequently used in a logic LSI, a CPU peripheral circuit module, such as a CPU core used as a control circuit, a random access memory used as a memory circuit, a timer, a serial communication interface circuit or the like, and a macrocell like an AND converter, a D/A converter or the like used as a signal processing circuit.

According to the above feature, since only one kind of cell may be designed for circuits having the same function, a maker can reduce the burden on the design and labor, such as the extraction of characteristics such as voltage dependency, temperature dependency, delay times or the like of each designed cell, the description thereof in the specifications, etc., and, in its turn, achieve a reduction in cost as well.

Further, a semiconductor integrated circuit device wherein the chip size, power consumption and operating speed are optimized, can easily be implemented by properly using substrate potential fixed and variable cells according to the functions or the like of circuit portions used with cells on one semiconductor chip and mixing them together in this condition. Typical ones of various features of the present invention have been described in brief. However, the various embodiments of the present invention and specific configurations of these embodiments will be more fully set forth in the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 4(A) and 4(B) are, respectively, plan views showing layout patterns of a substrate potential fixed CMOS inverter and a substrate potential variable CMOS inverter, each constructed using a common cell topology for a CMOS inverter;

FIG. 6(A) is a circuit diagram depicting another example of a substrate bias control circuit using substrate potential variable CMOS inverter cells;

FIG. 8(A) is a plan view showing one example of a memory array to which the present invention is applied;

FIG. 8(B) is a plan view of a detail of FIG. 8(A);

FIG. 19(A) is a cross-sectional view showing a structure of an LSI having a well-separate configuration, which is used as another embodiment of the present invention, and FIGS. 19(B) and 19(C) are respective plan views showing an example of each object configuration;

DETAILED DESCRIPTION OF THE PREFERRED EMBODIMENTS

Preferred embodiments of the present invention will hereinafter be described with reference to the accompanying drawings.

A description will first be made of how to view common cell topology, using a CMOS (Complementary MOS) inverter cell INV as an illustrative example.

Figure 1:
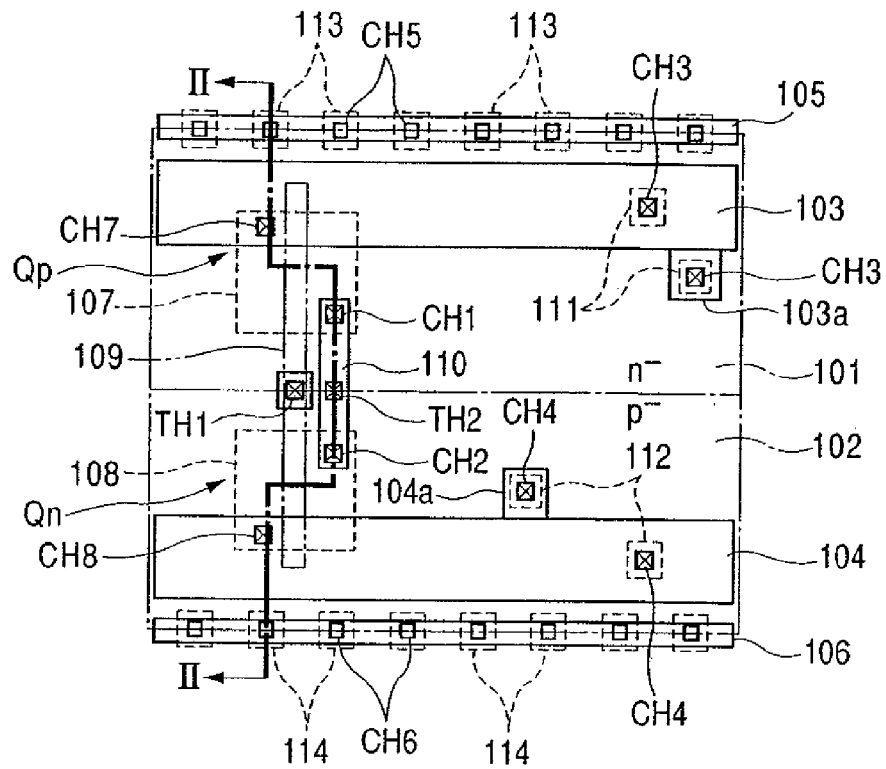
FIG. 1 is a plan view showing one example of the layout pattern a common cell topology for a CMOS inverter to which the present invention is applied.
Figure 2:
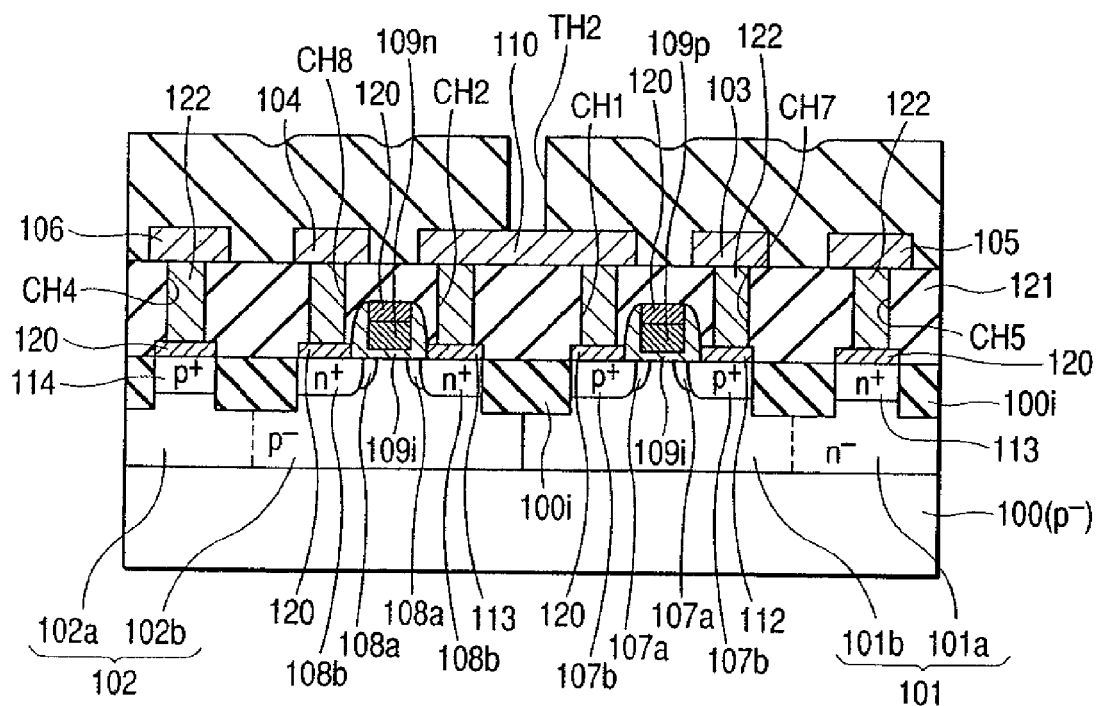
FIG. 2 is a cross-sectional of a section taken along line II.

FIGS. 1 and 2 respectively show one example of a common cell topology for a CMOS inverter cell INV comprised of a pair of elements including a p channel MISFET (Metal Insulator Semiconductor FET) Qp and an n channel MISFET Qn. Of these, FIG. 1 illustrates an example of a layout pattern of a circuit cell and FIG. 2 shows an example of a sectional view taken along line II-II of FIG. 1.

In FIGS. 1 and 2, reference numeral 100 indicates a p-type single-crystal silicon substrate used as a base, for example. Reference numeral 100i indicates a device or element separator, and reference numerals 101 and 102 indicate an n well region (101a, 101b) and a p well region (102a, 102b) defined as relatively low-density n-type and p-type semiconductor regions provided side by side in contact with each other, respectively. Reference numerals 103 and 104 respectively indicate a Vcc line and a Vss line used as power wired layers, which are respectively provided along the upper and lower sides of the n well region 101 and p well region 102. Reference numerals 105 and 106 respectively indicate a VBP line and a VBN1 line used as substrate potential supply wired layers located on the further outer sides of the Vcc line 103 and Vss line 104 and arranged in parallel to these wired layers. These power supply lines (103 through 106) are made up of a metal (aluminum) layer corresponding to a first layer, for example. Further, the power supply lines (103 through 106) are constructed so as to extend in a cell row direction.

Reference numeral 107 indicates an active region in which the p channel MISFET Qp is formed. Reference numeral 108 indicates an active region in which the n channel MISFET Qn is formed. The active regions 107 and 108 are defined by the device separator 100$i$. Reference numerals 107$a$ and 107$b$ respectively indicate relatively low-density p-type semiconductor regions and relatively high-density p+ type semiconductor regions provided in the n well region 101 and the active region 107. They serve as a source-to-drain region of the p channel MISFET Qp. Reference numerals 108$a$ and 108$b$ respectively indicate relatively low-density n-type semiconductor regions and relatively high-density n+ type semiconductor regions provided in the p well region 102 and the active region 108. They serve as a source-to-drain region of the n channel MISFET Qn. Reference numeral 109 indicates a gate electrode comprised of a polysilicon film or the like, which is provided so as to extend in the direction normal to the power supply lines 103 and 104 across the p well region 101 and the n well region 102. The gate electrode 109 is formed integrally with a gate electrode 109$p$ of the p channel MISFET Qp and a gate electrode 109$n$ of the n channel MISFET Qn.

The gate electrodes 109$n$ and 109$p$ are respectively formed on the well regions 101 and 102 with gate insulating films 109$i$ interposed therebetween. Further, a channel forming region of the p channel MISFET Qp is formed integrally with the n well region 101, whereas a channel forming region of the n channel MISFET Qn is formed integrally with the p well region 102.

Further, reference numeral 110 indicates a common drain electrode comprised of, for example; the metal (aluminum) layer or the like corresponding to the first layer, which is disposed in the direction orthogonal to the power supply lines 103 and 104 across the n well region 101 and the p well region 102. The common drain electrode 110 is designed so as to be electrically connected via contact holes CH1 and CH2 to the p-type semiconductor regions 107$a$ and 107$b$ and n-type semiconductor regions 108$a$ and 108$b$ respectively used as the source-to-drain regions at both ends.

Incidentally, symbols CH3 indicate contact holes for electrically connecting the Vcc line 103 to the n well region 101, symbols CH4 indicate contact holes for electrically connecting the Vss line 104 to the well region 102, symbols CH5 indicate contact holes for respectively electrically connecting the VBP line 105 to the n well region 101, symbols CH6 indicate contact holes for respectively electrically connecting the VBN line 106 to the p well region 102, symbol CH7 indicates a contact hole for electrically connecting the Vcc line 103 to the p-type semiconductor regions 107$a$ and 107$b$ serving as the source-to-drain region of the p channel MISFET Qp, and symbol CH8 indicates a contact hole for electrically connecting the Vss line 104 to the n-type semiconductor regions 108$a$ and 108$b$ serving as the source-to-drain region of the n channel MISFET Qn. Further, contact regions 111 through 114 comprised of high-density semiconductor regions for reducing contact resistance are respectively provided at substrate surface positions corresponding to the contact holes CH3 through CH6 of these contact holes, for supplying potentials to the well regions.

Incidentally, the contact regions 111 and 113 indicate n+ type semiconductor regions, which are formed in the same process as that for the semiconductor region 108$b$, for example. The contact regions 111 through 114 and the active regions 107 and 108 are defined by the device separator 100$i$. The device separator 100$i$ is formed by a structure in which an insulating film is embedded in a groove defined in the base 100.

Referring to FIGS. 1 and 2, symbol TH1 indicates a through hole used as an input terminal for electrically connecting the gate electrode 109 to a metal layer (upper wire or interconnection) 110' used as a first layer, which is located above the gate electrode 109 and is made up of an aluminum layer or the like. Symbol TH2 indicates a through hole used as an output terminal for electrically connecting the drain electrode 110 to a metal layer (upper interconnection) 110" used as a first layer, which is located above the drain electrode 110 and is comprised of an aluminum layer or the like. CH1 through CH9 and TH1 are formed at the same height.

In FIG. 2, conductive layers 120 formed over the surfaces of the source-to-drain regions 107$a$ and 107$b$ and 108$a$ and 108$b$ and the contact regions 111 through 114 are formed of a metal silicide layer (CoSi, TiSi or the like) for providing low resistance as well as on the surface of the polysilicon gate electrode 109. The conductive layers 120 and the power supply lines 103 through 106 are respectively spaced away from one another by an interlayer insulating film 121 and are respectively electrically connected to one another by connecting bodies 122 comprised of a conductive material such as tungsten or the like charged into the contact holes CH1, CH2, CH3, CH4 and CH5 through CH8 defined in the interlayer insulating film 121.

Figure 3A:
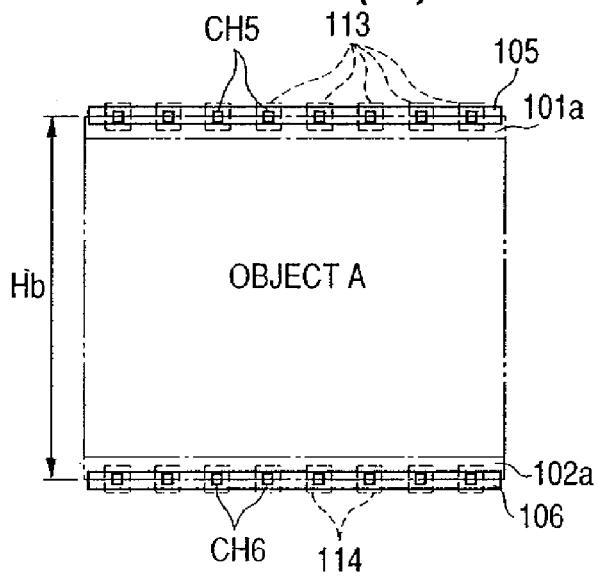
FIG. 3(A) is a plan view of object A.
Figure 3H:
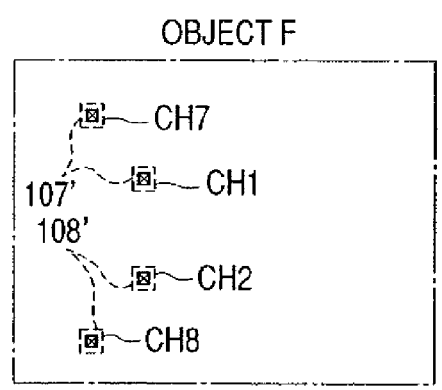
FIG. 3(H) is a plan view of an object F.
Figure 3B:
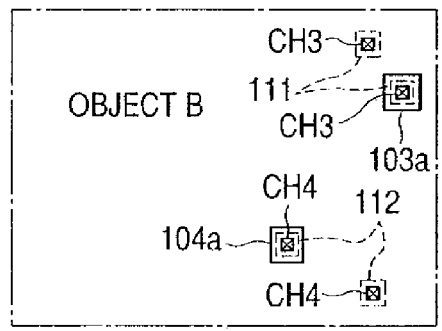
FIG. 3(B) is a plan view of a layout pattern depicting an object B.
Figure 3I:
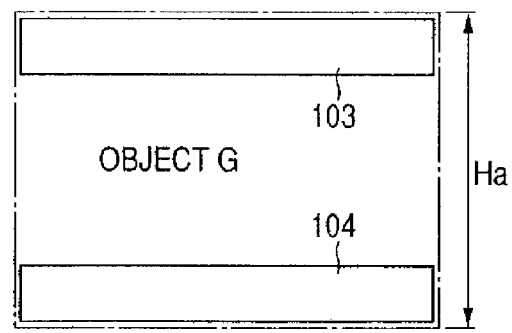
FIG. 3(I) is a plan view of an object G.
Figure 3C:
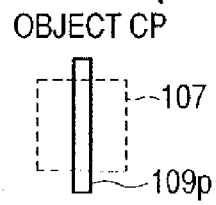
FIG. 3(C) is a plan view of an object CP.
Figure 3E:
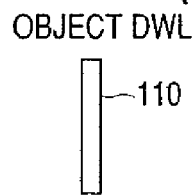
FIG. 3(E) is a plan view of an object DWL.
Figure 3J:
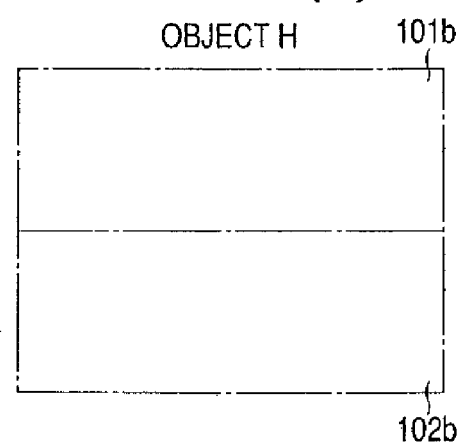
FIG. 3(J) is a plan view of an object H.

In the present embodiment, design data constituting the CMOS inverter INV is divided into the following objects A, B, CP, CN, DWL, DTH, E, F, G and H. That is, the VBP line 105 and VBN line 106, the contact holes CH5, CH6, contact regions 113 and 114 for respectively connecting these to the n well region 101 and p well region 102, and the n well 101$a$ and p well 102$a$ corresponding to parts of the well regions 101 and 102 just below or under the VBP line 105 and VBN line 106, respectively, constitute design data. These design data are prepared as one united object A (see FIG. 3(A). Similarly, the contact holes CH3 and CH4 and contact regions 111 and 112 for electrically connecting the Vcc line 103 and the Vss line 104 to the n well region 101 and p well region 102, and protrusions 103$a$ and 104$a$ used for providing contact with the Vcc line 103 and the Vss line 104, respectively, constitute design data. These design data are prepared as one united object B (see FIG. 3(B).

Figure 3D:
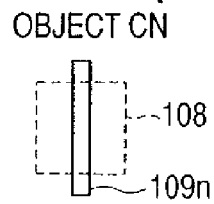
FIG. 3(D) is a plan view of an object CN.
Figure 3F:
FIG. 3(F) is a plan view of an object DTH.
Figure 3G:
FIG. 3(G) is a plan view of an object E.

The active region 107, p-type semiconductor regions 107$a$ and 107$b$ and gate electrode 109$p$ constitute design data as the p channel MISFET Qp which constitutes the inverter cell. These design data are prepared as one united object CP (see FIG. 3($c$). The active region 108, n-type semiconductor regions 108$a$ and 108$b$ and gate electrode 109$n$ make up design data as the n channel MISFET Qn which constitutes the inverter cell. These design data are prepared as one unified object CN (see FIG. 3(D).

As shown in FIGS. 3(C) through 3(J), other objects are also similarly configured as a unit of design data. That is, there are known, as other objects, an output contact structure (object DTH) comprising the drain electrode 110 (object DW) of the metal layer used as the first layer, and the through hole TH2 for connecting the drain electrode 110 to a wired layer (signal line) defined as an upper layer; an input contact structure (object E) comprising the through hole TH1 for connecting each gate electrode to an upper wired layer (signal line), and a buffer conductive layer BFM; a contact structure (object F) comprising the contact holes CH1, CH2, CH7 and CH8 for connecting the conductive layers such as the power supply lines 103 and 104, the drain electrode 110, etc. to the diffusion layers 107a, 107b, 103a and 108b, and high-density contact regions 107' and 108'; and a well structure (object H) for providing a conductive layer pattern (object G) constituting the power supply lines 103 and 104, and the well regions 101b and 102b.

Since the contact regions 107' and 108' are respectively substantially formed in the same process as that for the p-type semiconductor regions 107a and 107b and the n-type semiconductor regions 108a and 108b and formed integrally therewith, the illustration of these in FIG. 2 is omitted for ease in understanding the drawing. Incidentally, chain lines and two-dot chain lines in the objects, A, B, F and G shown in FIG. 3(A), FIG. 3(B), FIG. 3(H) and FIG. 3(I), respectively, indicate border lines indicative of the outside shapes of cells and do not indicate the components that constitute the respective objects.

The design data for the objects A through H are developed as hierarchical data called "plural layers" corresponding to a mask used in a production process. For example, the removal of the object A means that information about the layer constituting the object A is removed. A mask used in the production process is created by synthesizing or combining together the same data (hierarchical data) divided into or distributed to the objects A through H. For example, the gate electrode 109p of the object CP and the gate electrode 109n of the object CN are placed under the same layer (hierarchical data). A mask pattern for forming the polysilicon gate electrode 109 is formed by combining these hierarchical data together.

Further, the wiring 110 of the object DWL, the Vcc line 103 and Vss line 104 of the object G, and the VBP line 105 and VBN line 106 of the object A are the same hierarchical data. A mask pattern for forming the metal layer corresponding to the first layer is created by combining these hierarchical data together. Thus, the design data for forming the same mask pattern constitutes the same hierarchical data. In regard to the inverter cell illustrated in the present embodiment, the same layer may be associated with components or elements of different objects other than the objects A and B.

Figure 20A:
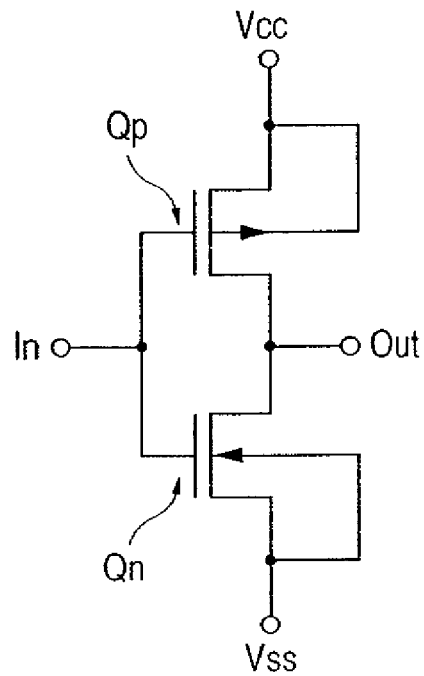
FIG. 20(A) is a circuit diagram illustrating an equivalent circuit of a substrate potential fixed CMOS inverter.
Figure 20B:
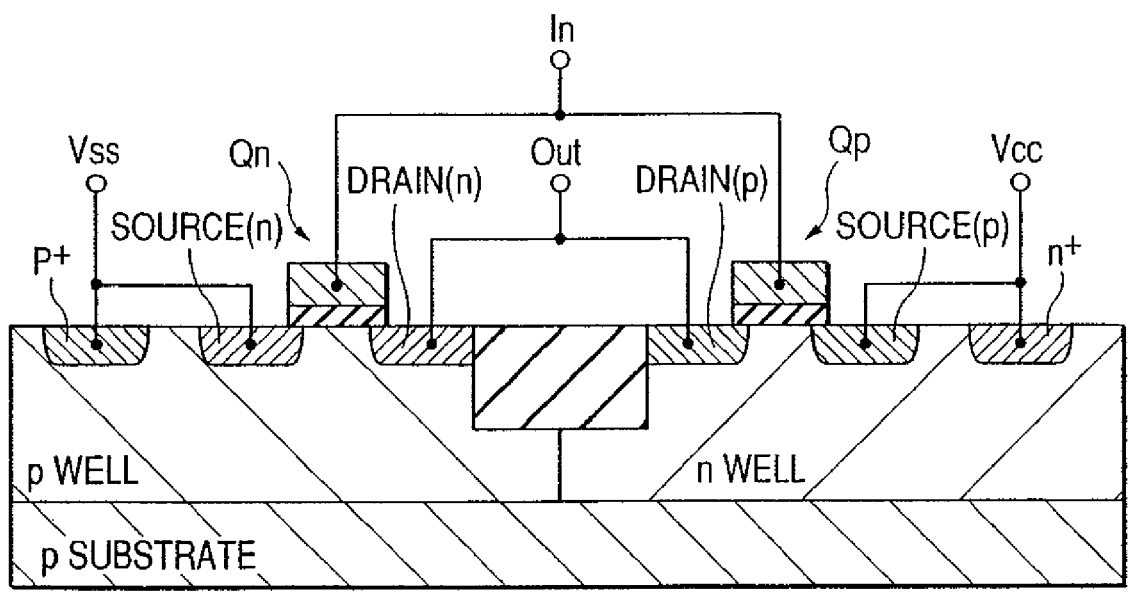
FIG. 20(B) is a cross-sectional view depicting a structure of the circuit shown in FIG. 20(A)
Figure 21A:
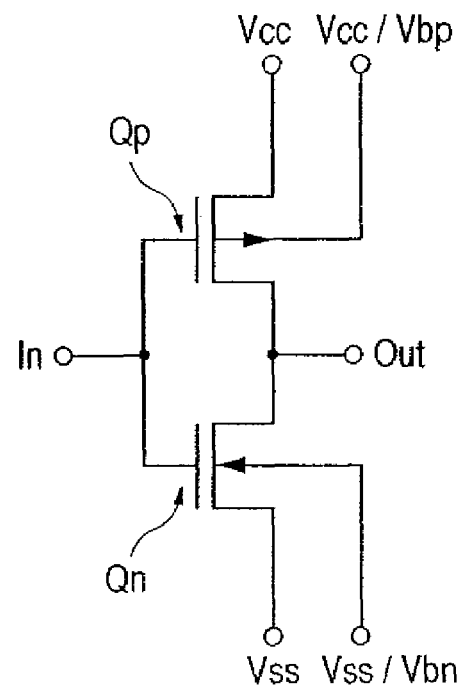
FIG. 21(A) is a circuit diagram illustrating an equivalent circuit of a substrate potential variable CMOS inverter.
Figure 21B:
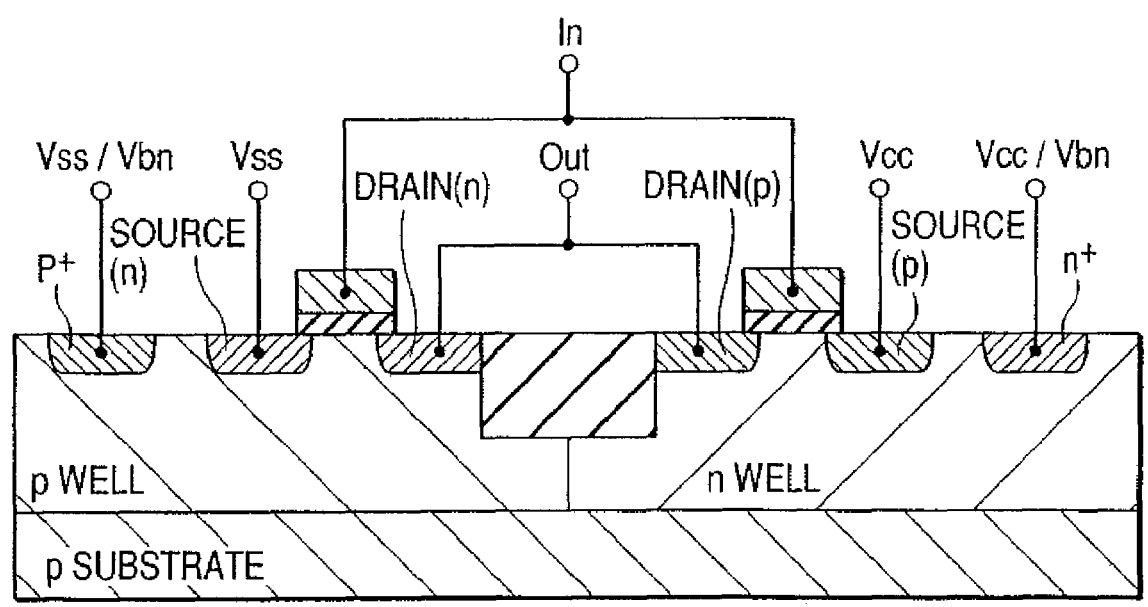
FIG. 21(B) is a cross-sectional view showing a structure of the circuit shown in FIG. 21(A).

When data obtained by eliminating the design data for the object A from the cell design data for forming the CMOS inverter cell shown in FIG. 1 are used (i.e., when the design data for the objects B through H are used), a substrate potential fixed CMOS inverter INV having a circuit configuration shown in FIG. 20(A) is constructed as shown in FIG. 4(A) wherein a Vcc line 103 and a Vss line 104 are electrically connected to the n well region 101 and the p well region 102 respectively. On the other hand, when data obtained by removing the design data for the object B from the design data for forming the CMOS inverter shown in FIG. 1 are used (i.e., when the design data for the objects A, CN and OP through H are used), a substrate potential variable CMOS inverter INV having a circuit configuration shown in FIG. 21(A) is constructed as shown in FIG. 4(B) wherein a VBP line 105 and a VBN line 106 are electrically connected to the n well region 101 and the p well region 102 respectively.

That is, a library for a substrate potential fixed cell or a library for a substrate potential variable cell can be formed by preparing the design data having the objects A through H as a common cell layout and eliminating the object A or B from the common cell layout. Thus, the term common cell topology refers to a method for forming two cell libraries using one common cell pattern and an approach therefor or the like.

That is, one common cell pattern is considered as an aggregate of objects. The two cell libraries can be formed from the common cell pattern by adding predetermined objects thereto.

Even in the case of NOR gate circuits, NAND gate circuits, switch circuits SW1 and SW2, RAM, etc. similar to the inverter cell, a common layout for logic circuit cells respectively comprising the NOR gate circuits, NAND gate circuits, switch circuits SW1 and SW2, RAM, etc. can be configured by suitably forming the objects CP, CN, DW, DTW, E, F and H.

Each cell library can be formed from the common cell pattern as a substrate potential common cell library in a manner similar to the CMOS inverter cell INV.

Further, the common, layout pattern for each logic circuit cell includes objects A and G each having cell heights Ha and Hb similar to those employed in the common layout pattern for the aforementioned CMOS inverter cell INV. Thus, when the logic circuit cells CELL using the substrate potential variable cell library are arranged in a cell row direction as shown in FIGS. 5(A), 5(B) and 5(C), their corresponding power supply lines (103 through 106) are respectively integrally formed and configured so as to extend in a cell direction.

That is, the substrate potential common library and the substrate potential variable cell library are created from the common layout pattern for the logic circuit cells. A desired logic circuit can be configured by opening one library thereof and placing and connecting the logic circuit cells CELL. In this case, the logic circuit cells CELL are arranged so as to adjoin each other in the cell row direction. The power supply lines (103 through 106) are integrally formed in the cell direction as shown in FIGS. 5(A), 5(B) and 5(C). Similarly, when the logic circuit cells CELL are disposed using the substrate potential fixed cell library in a cell row direction, they are placed adjacent to each other in the cell row direction and the power supply lines (103 and 104) are integrally formed in the cell direction as illustrated in FIGS. 5(C) and 5(B).

Figure 5A:
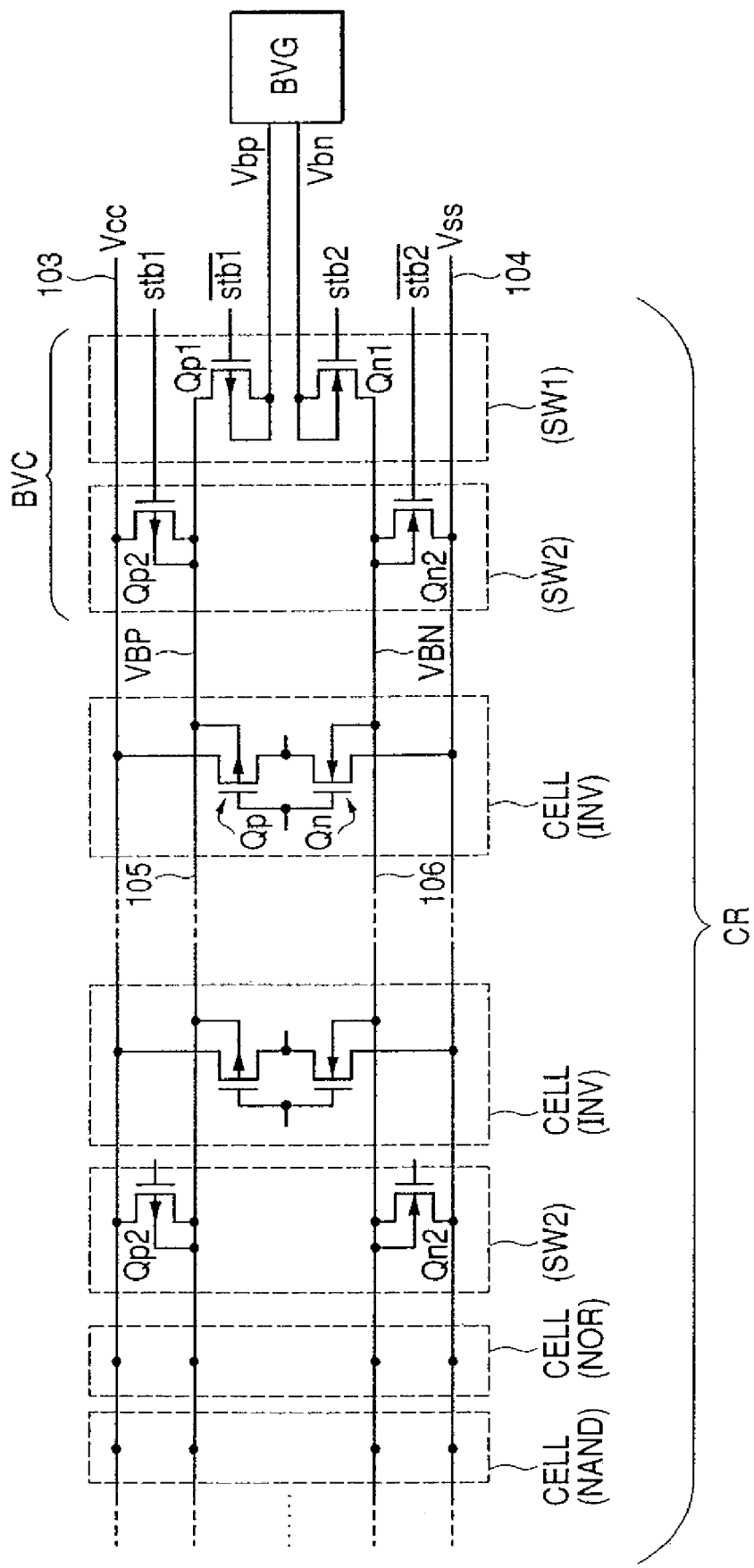
FIG. 5(A) is a circuit diagram illustrating an example of a configuration of a substrate bias control circuit using substrate potential variable CMOS inverter cells.
Figure 5C:
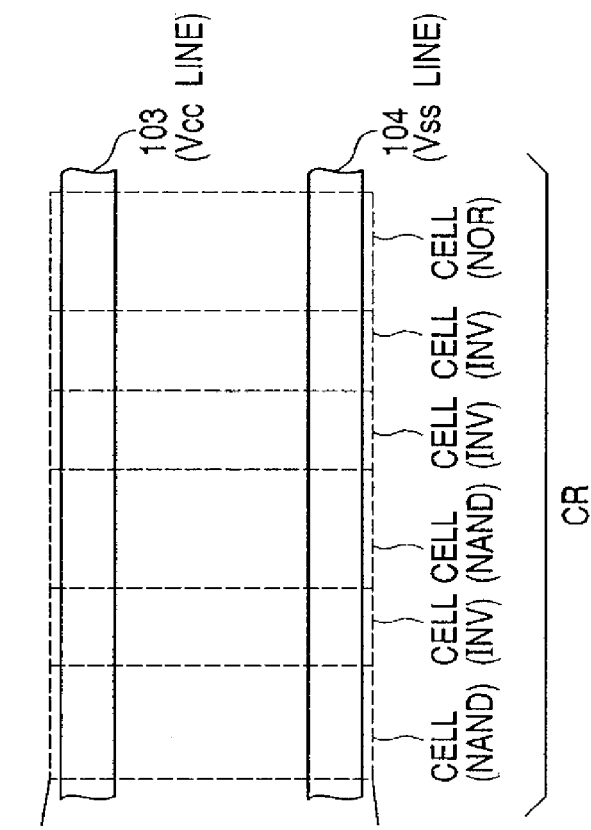
FIG. 5(C) is a plan view illustrating a layout pattern of substrate potential fixed logic cells.
Figure 5B:
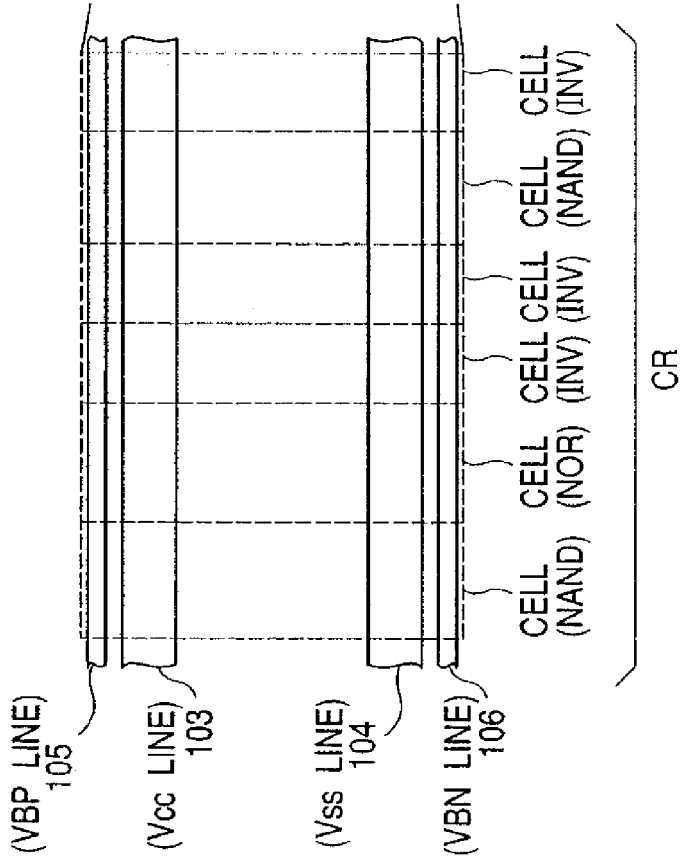
FIG. 5(B) is a plan view showing a layout pattern of substrate potential variable logic cells.

When the substrate potential variable CMIS inverter cells CELL or the like are selected, a substrate bias control circuit BVC for supplying bias voltages Vbp and Vbn generated from a bias voltage generator BVC shown in FIG. 5(A) or power sources Vcc and Vss to each inverter cell INV, are provided at a given position of a semiconductor chip and are controlled according to control signals stb1 and stb2 so as to apply bias voltages Vbp (=1.8V) and Vbn (0V) so as to set a reverse bias voltage developed between the source of MISFET and the substrate smaller than base potentials Vbp (=3.3V) and Vbn (=−1.5V) at standby to each of the individual well regions through a VBP line 10s and a VBN line 106 upon an active state in place of the base potentials Vbp and Vbn as shown in Table 1, for example. As shown in FIG. 6(A), basic circuit cells CELL are connected to one another in their cell directions by using wires or interconnections of a metal layer defined as a first layer and a metal layer defined as a second layer so as to constitute a desired logic circuit.

In the aforementioned embodiment, the objects A and B may be prepared as an aggregate of much smaller objects. Similar to the inverter cells referred to above, cells comprised of basic logic circuits such as NAND gate circuits, NOR gate circuits, etc. are designed so as to be capable of constituting either a substrate potential fixed circuit or a substrate potential variable circuit and may be registered in a library. Alternatively, cells capable of constituting both the substrate potential fixed circuit and the substrate potential variable circuit may be designed in a memory such as a RAM or the like so as to be registered in a library. Further, design information about the bias voltage generator BVG and substrate bias control circuit BVC may be registered in cell libraries as single circuit cells, respectively. In place of the mounting of the bias voltage generator BVC on the semiconductor chip, the bias voltages Vbp and Vbn may be supplied from the outside.

As is apparent from a comparison between FIG. 4(A) and FIG. 4(B) or a comparison between FIG. 5(B) and FIG. 5(C), the substrate potential fixed CMOS inverter cell shown in 4(A) is reduced in cell area by the VBP line 105 and the VBN line 106 as compared with the substrate potential variable CMOS inverter cell shown in FIG. 4(B). Thus, when it is desired to form a circuit that needs a high-speed operation, the substrate potential fixed CMOS inverter cell is selected, whereby a reduction in chip size preferentially can be achieved.

That is, when the substrate potential fixed cells CELL each shown in FIG. 4(A) are utilized in combination to form logic as shown in FIG. 5(C), regions for the VBP line 105 and the VBN line 106 can be used as wiring regions because the cell height Ha shown in FIG. 4(A) is smaller than that shown in FIG. 4 (B). It is therefore possible to reduce the chip size and provide high integration and high functioning. That is, since intervals defined between cell rows, which extend in the direction normal to a cell row direction, can be reduced in FIGS. 5(C) and 6(B), a reduction in chip size and high integration can be achieved. The interval between the adjacent power supply lines (103 and 104) employed in the cells CELL is the same as that for the substrate potential fixed cell and the substrate potential variable cell.

The configuration and operation of the substrate bias control circuit BVC will next be described using FIG. 5 (A) and Table 1.

The substrate bias control circuit BVC employed in the present embodiment comprises a first switch circuit SW1 comprised of a p channel MISFET Qp1 which is provided between the VBP line 105 employed in the embodiment shown in FIG. 1 as a substrate potential supply line and the bias voltage generator BVG and which is controlled by a control signal /stb1, and an n channel MISFET Qn1 provided between the VBN line 106 used as a substrate potential supply line and the bias voltage generator BVG and controlled by a control signal stb2, and a second switch circuit SW2 comprised of a p channel MISFET Qp2. provided between the Vcc line 103 and the VBP line 105 and controlled by a control signal stb1, and an n channel MISFET Qn2 provided between the Vss line 104 and the VBN line 106 and controlled by a control signal /stb2.

The second switch circuit SW2 is provided one by one per a predetermined number of basic circuit cells (inverter cells or NOR or NAND logic circuits (gates)), that is, a plurality of the second switch circuits SW2 are provided for each cell row CR. The first switch circuit SW1 is provided as a circuit common to the plurality of second switch circuits SW2. Thus, the MISFETs Qp1 and Qn1 constituting the first switch circuit SW1 are designed so as to be greater than the MISFETs Qp2 and Qn2 constituting the second switch circuit SW2 in device size. It is desirable for the pitch of placement of each second switch circuit SW2 to be reduced according to the operating frequency of an LSI and wiring resistances of the power supply Vcc and Vss lines 103 and 104 as the operating frequency increases and a voltage drop becomes great, thereby increasing the number of the second switch circuits SW2 provided within one cell row CR. It is thus possible to reduce a variation in substrate potential incident to a circuit operation and prevent the circuit from operating due to noise.

Thus, a desired logic circuit is configured by placing the basic circuit cells CELL and providing a connection between the basic circuit cells CELL using the wires or interconnections of the metal layers 110' and 110'' corresponding to the first and second layers. Incidentally, the logic circuit may be configured by placing a plurality of cell rows CR as shown in FIG. 6(A). In this case, the first switch circuit SW1 may be provided every cell rows CR. Alternatively, one cell row CR may be provided for the logic circuit as shown in FIG. 6(A). As shown in FIGS. 6 (A) and 6 (B), the intervals defined between the adjacent cell rows CR are used as wiring regions and connections between the cell rows or within each cell are made by using the interconnections of the metal layers 110' and 110'' corresponding to the first and second layers.

Further, the substrate bias control circuit BVC sets the control signals stb1,/stb1, stb2 and /stb2 to Vss (=0V), Vbp (=3.3v), Vbn (=−1.5V) and Vcc (=1.8V) respectively. Thus, the MISFETs Qp1 and Qn1 of the switch SW1 are turned off and the MISFETs Qp2 and Qn2 of the switch circuit SW2 are turned on so that the source voltages Vcc and Vss are respectively supplied to the VBP and VBN lines 105 and 106 connected to their corresponding inverter cells INV. Thus, each MISFET of the inverter cell INV undergoes or receives a low reverse bias voltage between the source thereof and the substrate to reduce its threshold, whereby it operates at high speed.

TABLE 1

| | | Active | Standby |
|---|---|---|---|
| Power Source | Vcc Voltage | 1.8 V | |
| | Vss Voltage | 0.0 V | |
| | Vbp Voltage | — | 3.3 V |
| | Vbn Voltage | — | −1.5 V |
| Control Signal | Stb1 | L (0.0) | H (3.3) |
| | stb1 | H (3.3) | L (0.0) |
| | stb2 | L (−1.5) | H (1.8) |
| | stb2 | H (1.8) | L (−1.5) |
| controlled Power | VBP line | Vcc (1.8) | Vbp (3.3) |
| | VBN line | Vss (0.0) | Vbn (−1.5) |

On the other hand, the control signal stb1 is set to Vbp (=3.3V), the control signal /stb1 is set to Vss (=0V), the control signal stb2 is set to Vcc (=1.8V) and the control signal /stb2 is set to Vbn (=−1.5V), respectively upon non-operation of the circuit (at standby) as shown in Table 1. Thus, the MISFETs Qp1 and Qn1 of the switch circuit SW are turned on and the MISFETs Qp2 and Qn2 of the switch circuit SW2 are turned off so that the VBP line 105 and the VBN line 106 electrically connected to each inverter cell INV are supplied with bias voltages Vbp and Vbn generated from the bias voltage generator BVC. As a result, a high reverse bias voltage is applied between the source of each MISFET of the inverter cell INV and the substrate to thereby increase the threshold of each MISFET, whereby leakage current is reduced. Incidentally, Table 1 shows examples of bias voltages at the time that the source voltage Vcc supplied from the outside is 1.8V. If the source voltage Vcc varies, then the bias voltages Vbp (Vbp>Vcc) and Vbn (Vbn<Vss) suitably vary according to such variation. Since the Vbn potential and the Vbp potential are potentials to be supplied to the well regions 101 and 102 respectively, less current variation is provided and the wiring widths of the VBP line 105 and VBN line 106 are formed so as to be thinner than those of the VCG line 103 and Vss line 104 as shown in FIGS. 4(A) and 4(B). Thus, the provision of the VBP line 105 and VBN line 106 allows a reduction in the increase in each cell CELL size.

Figure 7A:
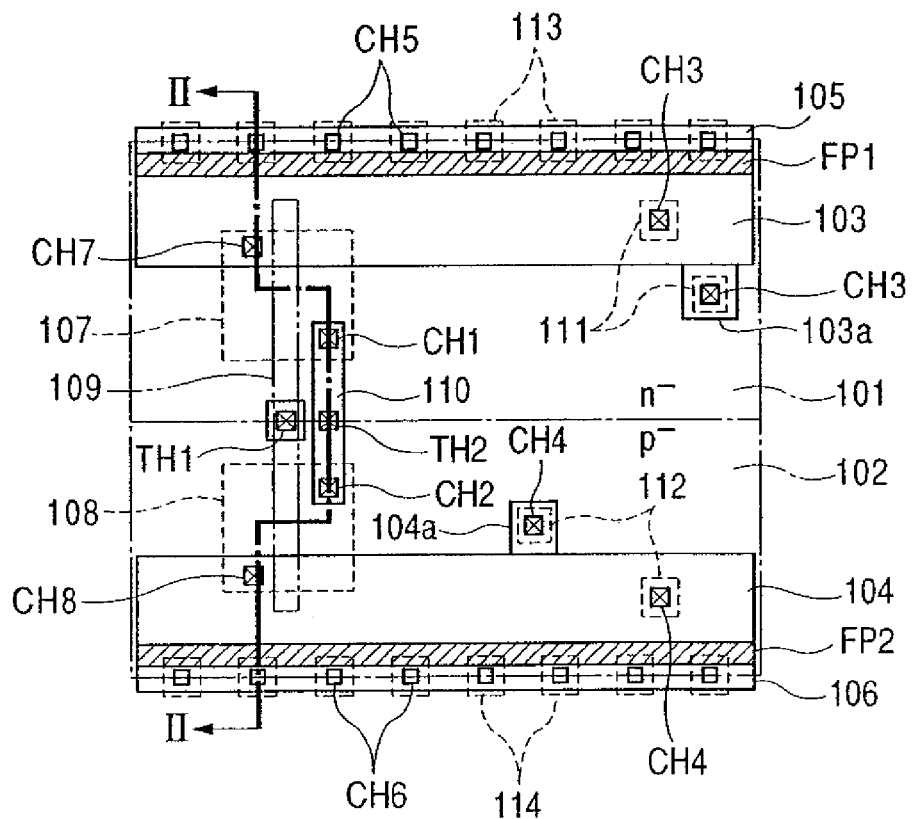
FIG. 7(A) is a plan view of a layout pattern illustrating another example of a common cell topology for a CMOS inverter.
Figure 7B:
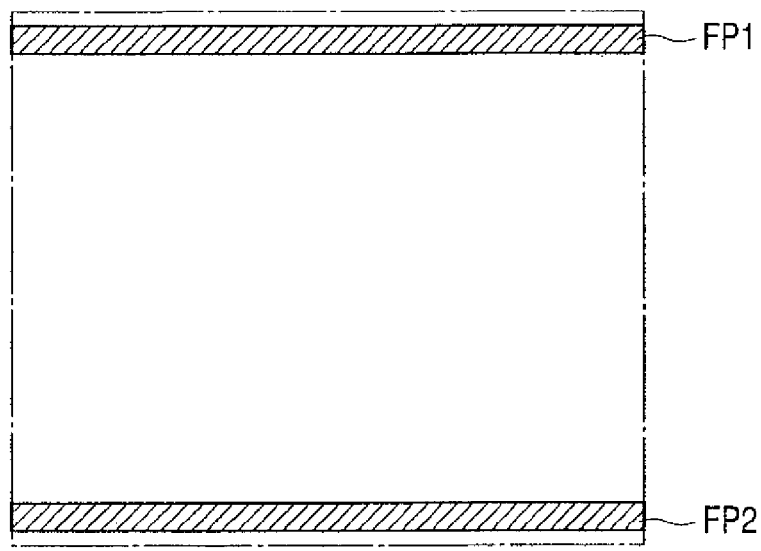
FIG. 7(B) is a plan view of a layout pattern depicting an object B'.

The aforementioned embodiment has been described for the case in which the design data constituting the VBP line 105 and VBN line 106, and the contact holes CH5, CH6 and contact regions 113 and 114 for respectively connecting these to the n well region 101 and p well region 102, and the parts of the well regions 101 and 102 just below or under the VBP line 105 and VBN line 106 are prepared as one unified object A, and the design data constituting the contact holes CH3 and CH4 and contact regions 111 and 112 for electrically connecting the Vcc line 103 and the Vss line 104 to the n well region 101 and p well region 102, and the protrusions 103a and 104a used for providing contact with the Vcc line 103 and the Vss line 104 are prepared as one united object B. However, the two objects A and B are set as one object A' and design information about such patterns FP1 and FP2 as to fill intervals between a VCC line 103 and a Vss line 104 and between a VBP line 105 and a VBN line 106 with the same conductive layer (corresponding to a metal (aluminum) layer corresponding to a first layer) is prepared as another object B' (see FIG. 7(B)) as indicated by hatching in FIG. 7(A) aside from the object A'. In this condition, either a substrate potential fixed cell or a substrate potential variable cell may be formed according to whether the object B' for the interval filling should be included in the object A'.

Further, either the substrate potential fixed cell or the substrate potential variable cell may be formed depending on whether in a state in which the objects A' and B' are prepared as one object A", the object B' is eliminated from the object A" or left as it is.

However, since any cell takes the same shape (outside shape) in such a case, the effect of reducing each cell area is not obtained even when the substrate potential fixed cell is selected. As an alternative to this, however, another effect can be obtained in that each logic circuit is improved in reliability and performance to stabilize a well potential due to a reduction in resistance incident to an increase in the width of each power supply line, the stabilization of the source potentials and an increase in the number of contacts.

Further, the aforementioned embodiment has described the case where the information about the contact holes CH3 through CH6 for connecting the Vcc line 103 and Vss line 104 and the VBP line 105 and VBN line 106 to their corresponding well regions 101 and 102 are contained in the same object as that for the information about their corresponding power supply lines. However, the information about the contact holes is omitted from the object including the information about the power supply lines, and substrate contact holes may be defined or produced in blank areas lying under the respective power supply lines by an automatic layout editor/program. That is, the objects constructive of the common layout pattern for the logic circuit cells are not necessarily limited to the above. It is needless to say that changes can be made thereto within a scope not changing the substance of the present invention.

A description will next be directed to a common cell topology at the time that a substrate potential applied to each of the memory cells constituting a RAM incorporated in an LSI is fixed or varied. In the present embodiment, the memory cells are the same and power supply portions, relative to well regions in which p channel MISFETs and n channel MISFETs constituting the memory cells are respectively formed, are formed by a common cell topology.

Figures 8A, 8B:
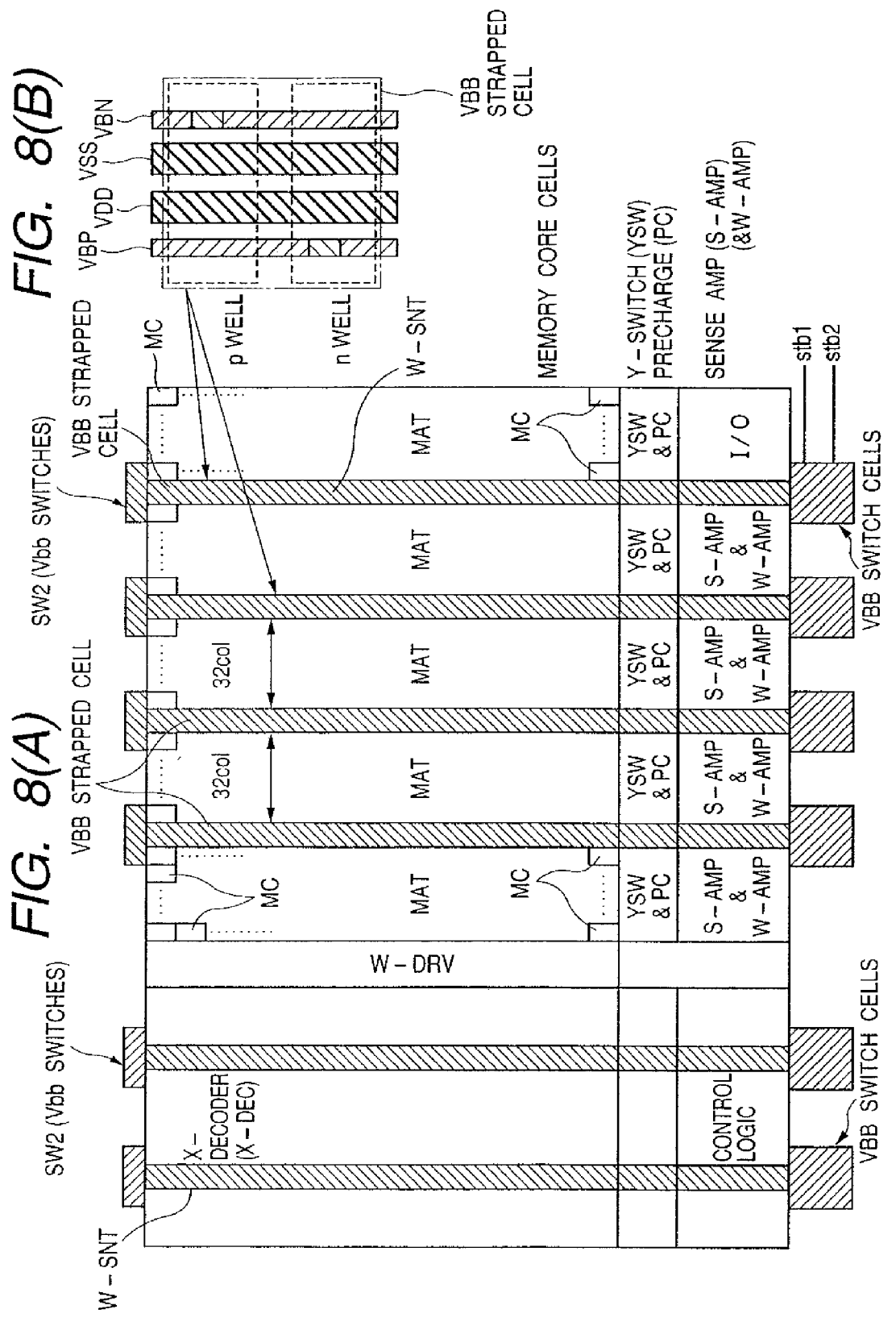

FIG. 8(A) shows the configuration of the entire memory array. In the memory array illustrated in accordance with the present embodiment, memory mats MATs respectively having 32×n memory cells MC placed in matrix form are arranged on both sides of an X decoder circuit X-DEC with the X decoder circuit interposed therebetween. Word drivers W-DRV for respectively driving word lines to select levels are disposed adjacent to the X decoder circuit X-DEC on both sides thereof. As indicated by the diagonally shaded areas, word shunt areas W-SNT for coupling two layered word lines at suitable pitches to thereby prevent level-down are formed between the memory mats extending in a word line direction (i.e., in a transverse direction in FIG. 8(A)). Precharge circuits PC and a column switch row YSW are disposed at one end of the memory mats. Further, sense amplifiers S-AMP and write amplifiers W-AMP for respectively amplifying signals on data lines are placed adjacent to the precharge circuits PC and the column switch row YSW.

Figure 9:
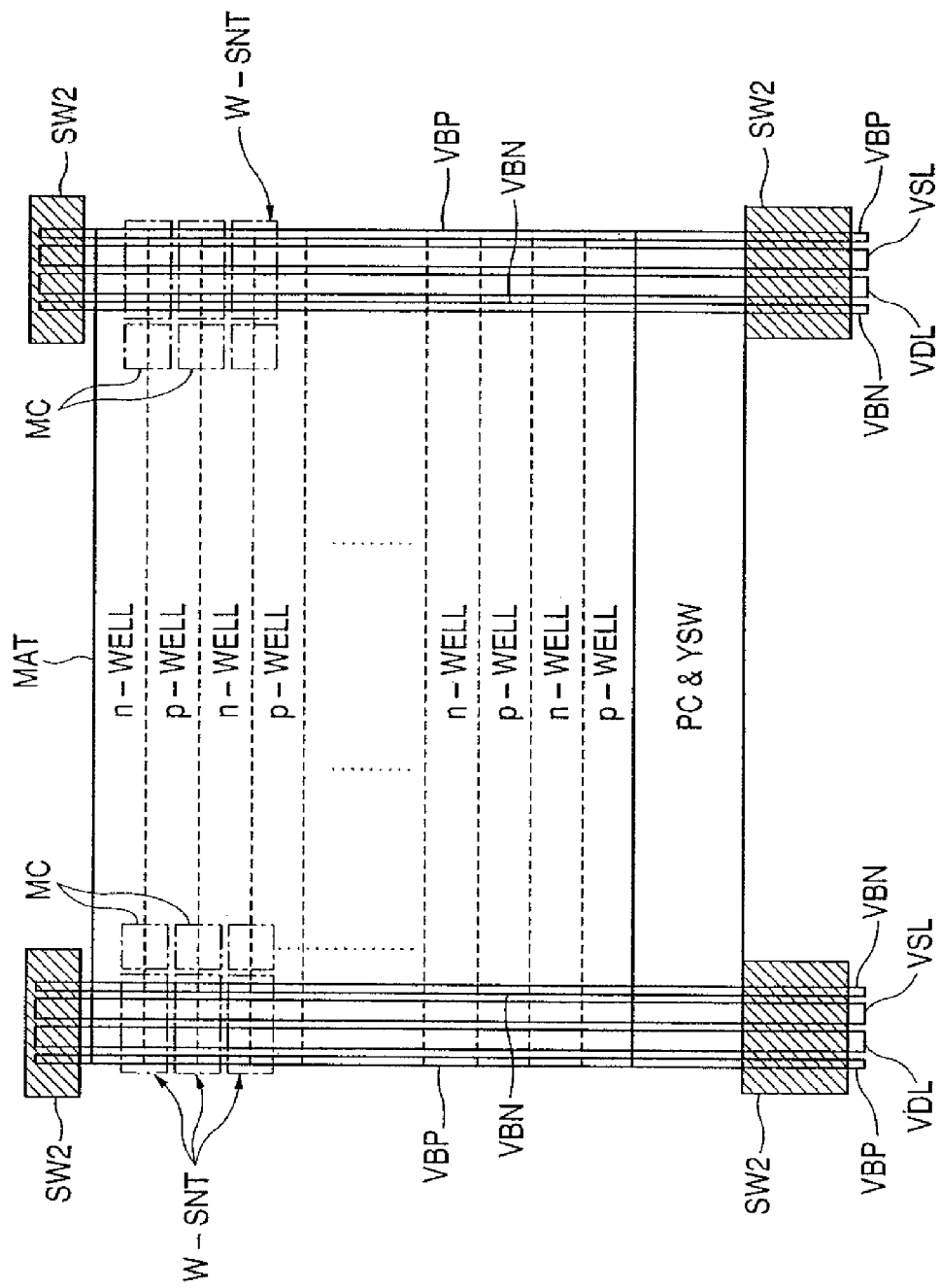
FIG. 9 is a plan view illustrating a memory mat having memory cell power supply portions to which the present invention is applied.

FIG. 9 shows one memory mat MAT placed in a state in which word lines are omitted therefrom. As shown in FIG. 9, n well regions n-WELL and p well regions p-WELL are alternately arranged within the memory mat along a data line direction (i.e., in the longitudinal or vertical direction as seen in FIG. 9). In the present embodiment, power supply lines VDL and VSL and lines VBP and VBN for respectively supplying substrate potentials Vbp and Vbn are disposed within the word shunt areas W-SNT so as to extend along the direction (i.e., data vertical direction) normal to the word lines. Circuits equivalent to the aforementioned switch circuits SW2 are respectively placed at both ends of the word shunt areas W-SNT as seen in the data vertical direction. Each word shunt area W-SNT is provided with a power feeding or supply portion for supplying power to a common well region for the memory cells extending in the word line direction. The power supply portions are formed by a common cell topology. That is, VBB strapped cells used as such memory power supply cells as shown in FIG. 8(B) are respectively placed within the word shunt areas W-SNT corresponding to the power supply portions. The memory power supply cells are constructed by a common cell topology.

Figure 10A:
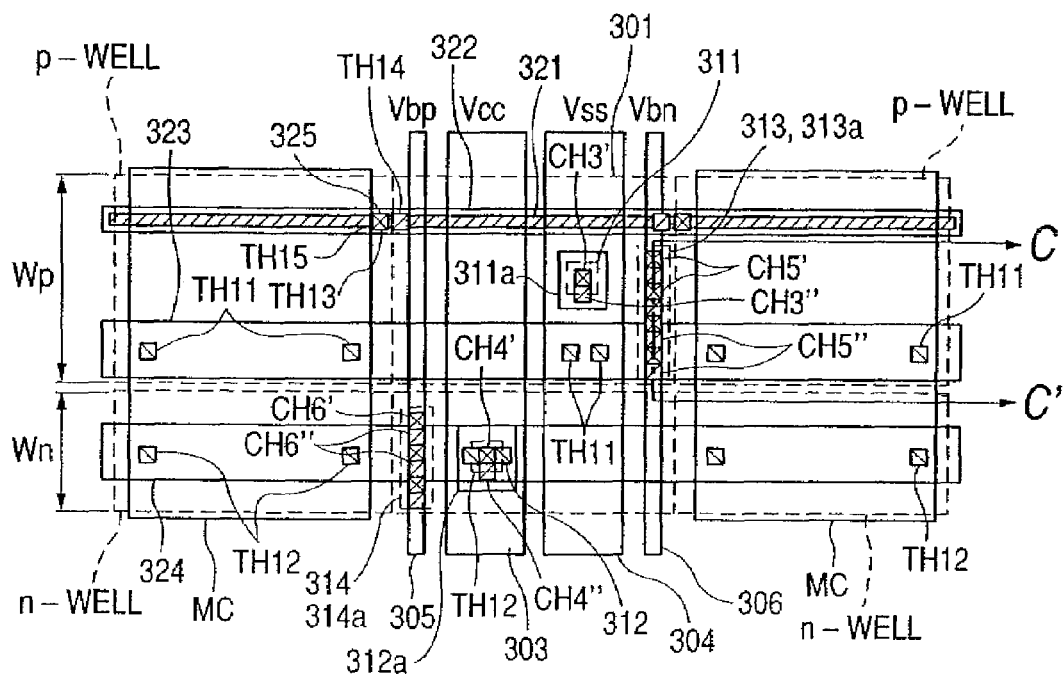
FIG. 10(A) is a plan layout pattern view and FIGS. 10(B) and 10(C) are cross-sectional views showing an embodiment of a common cell topology for a memory cell power supply portion.

FIG. 10(A) shows an embodiment of a common cell topology for the VBB strapped cells placed in the power supply portions for the memory cells. The embodiment shown in FIG. 10(A) corresponds to a common cell topology designed by an idea similar to that for the embodiment of FIG. 1 indicative of the inverter cell. The VBB strapped cells are equivalent to the memory power supply cells disposed within the word shunt areas W-SNT. In FIG. 10(A), memory cells MC are respectively disposed one by one on both sides of each memory power supply cell.

In FIG. 10(A), reference numeral 301 indicates a p well region having the same width Wp as that of a p well region p-WELL of each memory cell in a memory mat and placed so that the p well region is formed integrally with the p-WELL in a word line direction. Reference numeral 302 indicates an n well region having the same width Wn as that for an n well region n-WELL of each memory cell and placed so as to be formed integrally with the n well regions n-WELL in the word line direction. Reference numeral 303 indicates a power supply line (Vcc line) for supplying a source voltage Vcc, which is placed in the direction (i.e., in a data line direction corresponding to the vertical direction as seen in the drawing) intersecting the well regions 301 and 302. Reference numeral 304 indicates a power supply line (Vss line) for supplying a reference voltage Vss, which is placed in the data vertical direction that intersects the well regions 301 and 302. Reference numeral 305 indicates a VBP line placed outside the power supply lines 303 and 304 in parallel to these and defined as a substrate potential supply line for supplying a substrate potential Vbp. Reference numeral 306 indicates a VBN line placed outside the power supply lines 303 and 304 in parallel to these and defined as a substrate potential supply line for supplying a substrate potential Vbn. Although the invention is not restricted in particular, the power supply lines 303 and 304 and the substrate potential supply lines 305 and 306 are formed by a metal layer corresponding to a second layer, which is made up of a conductive layer such as aluminum or the like. Incidentally, a metal layer corresponding to a first layer is used to connect between devices or elements (MISFETs) in each memory cell, as will be described later.

Referring also to FIG. 10(A), symbols CH3' and CH4' respectively indicate contact holes for respectively electrically connecting the power supply lines 303 and 304 to the p well region 301 and the n well region 302. Reference numeral 311 indicates a p-type contact region comprised of a p+ type semiconductor region for reducing a contact resistance formed in the p well region 301 in association with the contact hole CH3'. Reference numeral 312 indicates an n-type contact region comprised of an n+ type semiconductor region for reducing a contact resistance formed in the n well region 302 in association with the contact hole CH4'. Symbols CH5' and CH6' respectively indicate contact holes for respectively electrically bringing the substrate potential supply lines 305 and 306 into contact with the n well region 301 and the p well region 302. Reference numeral 313 indicates a contact region comprised of a p+ type semiconductor region, which is formed in the p well region 301 in correspondence with the contact hole CH5'. Reference numeral 314 indicates a contact region comprised of an n+ type semiconductor region, which is formed in the n well region 302 in association with the contact hole CH6'.

The power supply lines and the substrate potential supply lines (303 through 306) respectively comprised of the upper metal layer corresponding to the second layer are electrically connected through a respective via (contact holes) of CH3", CH4", CH5" and CH6" respectively corresponding to CH3', CH4', CH5' and CH6'. Reference numerals 311a, 312a, 313a and 314a respectively indicate buffer conductive layers formed so as to be taken or drawn out toward the power supply lines and substrate potential supply lines 303 through 306 comprised of the metal layer corresponding to the second layer from the semiconductor regions 311, 312, 313 and 314. That is, the buffer conductive layers 311a, 312a, 313a and 314a are respectively formed by the metal layer corresponding to the first layer.

Figure 10B:
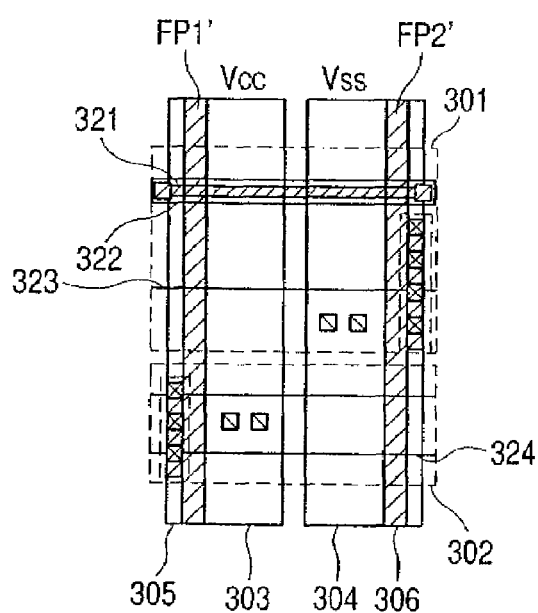
Figure 10C:
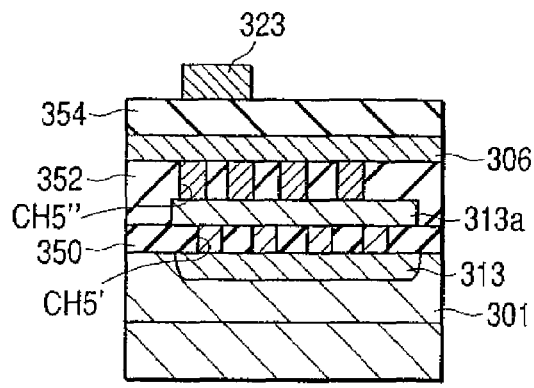

FIG. 10(C) is a cross-sectional view cut off at a position taken along line C-C' in FIG. 10(A) and illustrates each power supply line.

The VBN line 306 is electrically connected to the buffer conductive layer 313a through the contact hole CH5'. The buffer conductive layer 313a is electrically connected to the p+ type semiconductor region 313 through the contact hole CH5'. Similarly, the Vss line 304 is electrically connected to the buffer conductive layer 311a through the contact hole CH3". The buffer conductive layer 311a is electrically connected to the p+ type semiconductor region 311 through the contact hole CH3'. Likewise, the Vcc line 303 is also electrically connected to the n+ type semiconductor region 312 through the contact holes CH4' and CH4" and the buffer conductive layer 312a. The VBP line 305 is electrically connected to the n+ type semiconductor region 314 through the contact holes CH6' and CH6" and the buffer conductive layer 314a.

Further, reference numeral 321 indicates a word line comprised of a polysilicon layer or the like, which is placed in the direction (i.e., in the word line direction corresponding to the transverse direction as seen in the drawing) intersecting the power supply lines 303, 304, 305 and 306 and which is formed integrally and provided continuously with word lines lying within the memory cells. Reference numeral 322 indicates a word shunt line which is disposed above the word line 321 with an insulating film interposed therebetween and to which the same voltage waveform as, that for the word line 321 is applied. Reference numerals 323 and 324 respectively indicate transverse power supply lines placed in parallel to the word lines 321 for respectively supplying the source voltages Vcc and Vss to the memory cells. Although the invention is not restricted in particular, the word shunt line 322 and the power supply lines 323 and 324 are comprised of a metal layer corresponding to a third layer, which is made up of a conductive layer such as aluminum or the like.

Symbol TH11 indicates a through hole for electrically connecting the Vss line 304 to the transverse Vcc line 323. Symbol TH12 indicates a through hole for electrically connecting the Vcc line 303 to the transverse Vss line 324. Symbols TH13, TH14 and TH15 respectively indicate through holes for electrically connecting the word shunt line 322 to the word line 321. Since it is difficult to bring the word shunt line 322 into direct contact with the word line 321 because the word shunt line 322 is formed of the metal layer corresponding to the third layer, buffer conductive layers 325 and 325' comprised of the metal layer corresponding to the first layer are formed between the word shunt line 322 and the word line 321. Thus, the word shunt line 322 is electrically connected to the word line 321 through the buffer conductive layers 325 and 325' and the through holes TH13, TH14 and TH15. That is, the word shunt line 322 is electrically connected to the buffer conductive layer 325' through the through hole TH15. The buffer conductive layer 325' is electrically connected to the buffer conductive layer 325 through the through hole TH14. The buffer conductive layer 325 is electrically connected to the word line 321 via the through hole TH13.

In the present embodiment, the aforementioned contact holes CH3', CH4', contact regions 311 and 312, Via regions CH3" and CH4", and buffer conductive layers 311a and 312a comprised of the metal layer corresponding to the first layer respectively constitute design data as shown in FIG. 11 (B). These design data are constructed as one object AM. As shown in FIG. 11(A), the aforementioned contact holes CH5' and CH6', Via regions CH5" and CH6", contact regions 313 and 314, and buffer conductive layers comprised of the first-layered metal layer are constructed as another object BM.

Figure 11A:
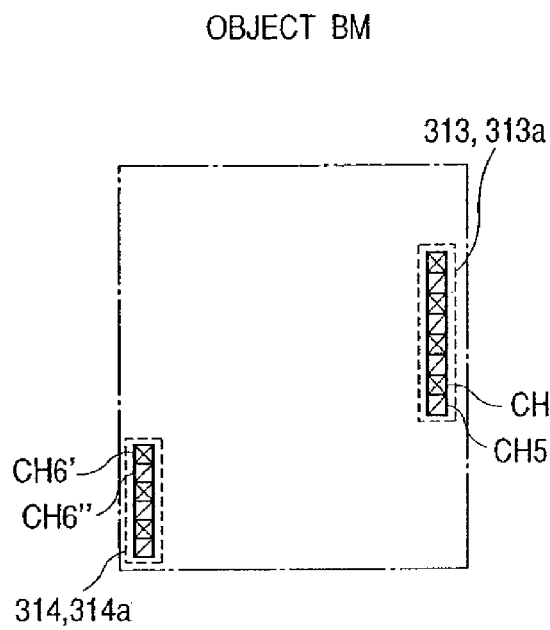
FIG. 11(A) through FIG. 11(D) are respective plan views illustrating the layout pattern of an example of each object configuration of a memory cell power supply portion.
Figure 11C:
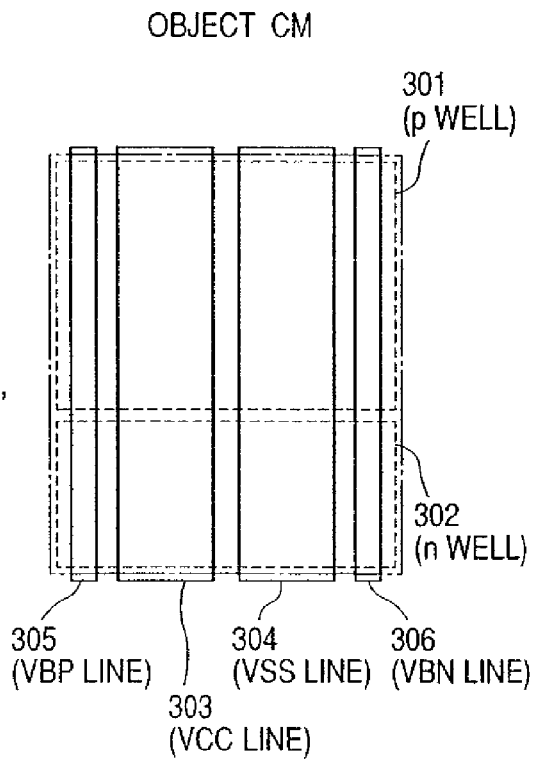
Figure 11B:
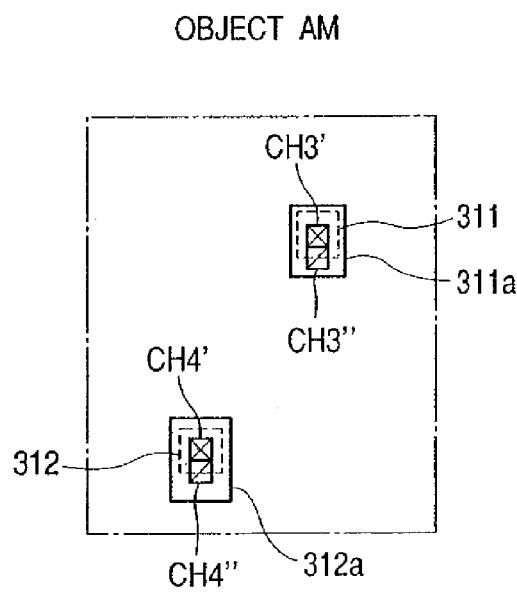
Figure 11D:
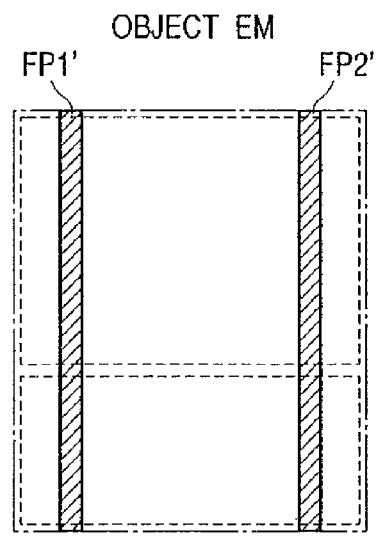

As shown in FIG. 11(C), a p well region 301, an n well region 302, a Vc line 303, a Vss line 304, a VBP line 305 and a VBN line 306 respectively constitute design data. These design data are constructed as one united object CM. Either a substrate potential fixed cell or a substrate potential variable cell is formed by selectively adding one of these objects AM and BM to the object CM corresponding to a common layout pattern. That is, when the objects AM and CM are selected, the corresponding power supply portion functions as the substrate potential fixed cell (memory power supply cell). The Vcc line 303 is electrically connected to the n well region n-WELL 302 so that the source voltage Vcc is supplied to the n well region n-WELL of each memory cell MC at all times. On the other hand, the Vss line 304 is electrically connected to the p well region p-WELL 301 so that the source voltage Vss is supplied to the p well region p-WELL 301 of each memory cell MC.

On the other hand, when the objects BM and CM are selected, the corresponding power supply portion serves as the substrate potential variable cell (memory power supply cell). That is, the VBP line 305 is electrically connected to the n well region n-WELL 302 and the VBN line 306 is electrically connected to the p well region p-WELL 301. Upon operation, the source voltage Vcc is supplied to the n well region n-WELL 302 of each memory cell through the VBP line 305 according to the aforementioned switching control signals stb1 and stb2, whereas upon standby, a bias voltage Vbp like 3.3V is supplied to the n well region n-WELL 302 through the VBP line 305 according to the switching control signals stb1 and stb2. On the other hand, a source voltage Vss (0V) is supplied to the p well region p-WELL 301 through the VBN line 306 upon operation, whereas a bias voltage Vbn like −1.5V is supplied to the p well region p-WELL 301 through the VBN line 306 upon standby.

Owing to the provision of either the substrate potential fixed cells or the substrate potential variable cells within the word shunt regions W-SNT shown in FIG. 8(A) along the data line direction, the Vss line, the VBN line and the VBP line provide electrical connections between the switches SW2 placed at both ends of each memory mat MAT as seen in the data line direction.

FIG. 10(B) shows another embodiment of the common cell topology for the power supply portions. The present embodiment corresponds to a common cell topology designed under the same idea as that for the embodiment of FIG. 7 indicative of the inverter cell. Parts designated by the same reference numerals as those in FIG. 10(A) indicate the same parts respectively.

In the present embodiment, the two objects BM and CM illustrated in the embodiment shown in FIG. 10(A) are set as one object DM. Further, design information (design data) about patterns FP1' and FP2' so as to fill intervals between a VCC line 303 and a Vss line 304 and between a VBP line 305 and a VBN line 306 with the same conductive layer (corresponding to a metal layer corresponding to a second layer, which is comprised of an aluminum layer) is prepared as another object EM (see FIG. 11(D)) as indicated by hatching in FIG. 10(B) aside from the object DM. In this condition, either a substrate potential, fixed power supply cell, or a substrate potential variable power supply cell can be formed according to whether the object EM for the interval filling is included in the object DM. In each cell in which the object EM is added to the object DM, the VBP line 305 and the VBN line 306 are respectively formed integrally with the Vcc line 303 and the Vss line 304, and function as lines for supplying the source voltages Vcc and Vss.

It is needless to say that a further embodiment may connect both Vbp and Vdd, and Vbn and Vss by the same conductive layer (aluminum layer) outside Vbb switch cells (SW2) lying beyond the memory mats shown in FIGS. 8 and 9 without having to use the patterns FP1' and FP2'.

Figure 12A:
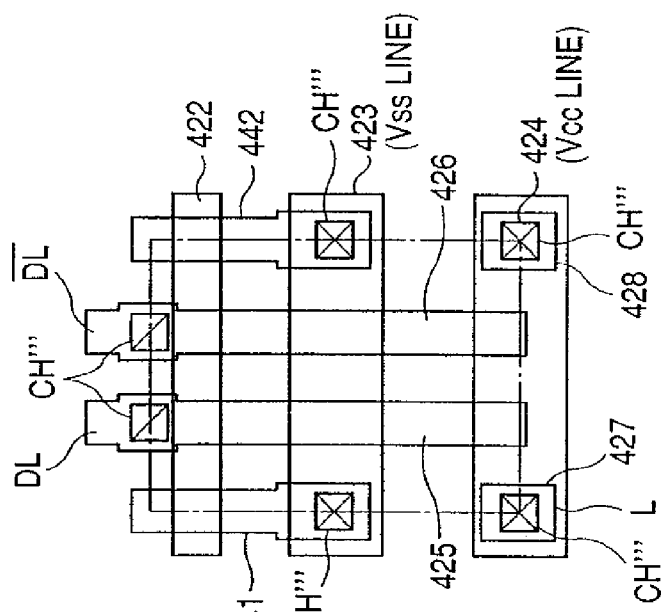
FIG. 12(A) through FIG. 12(C) are respective plan views depicting the layout pattern of an embodiment of a cell topology of each memory cell.
Figure 12B:
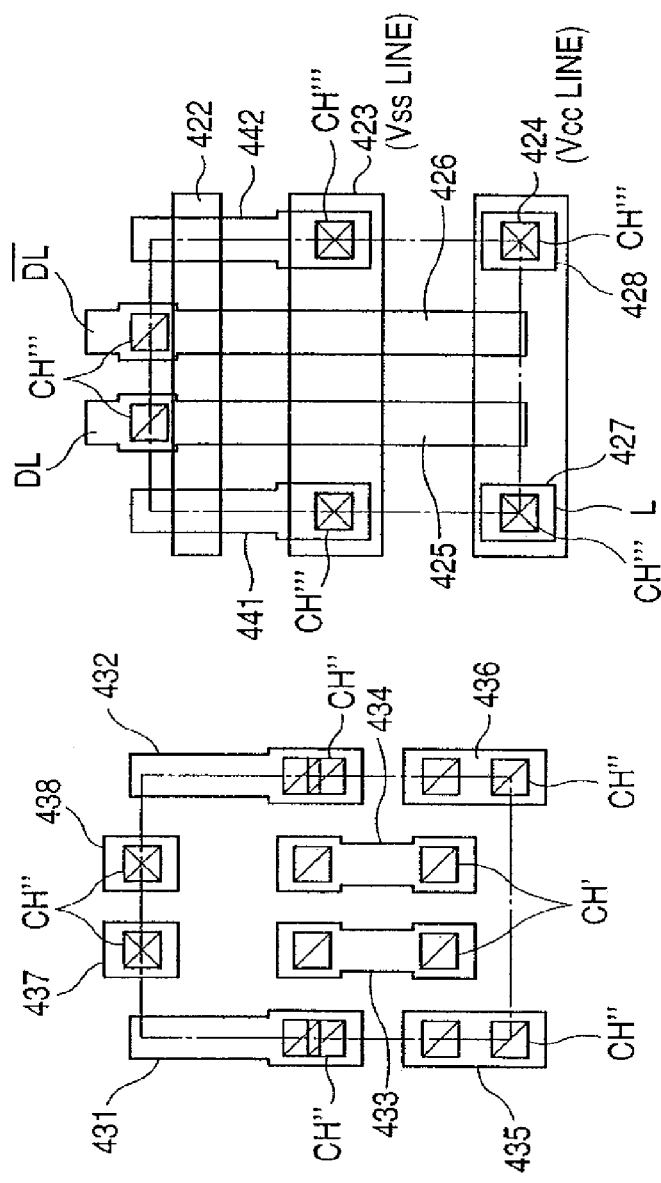
Figure 12C:
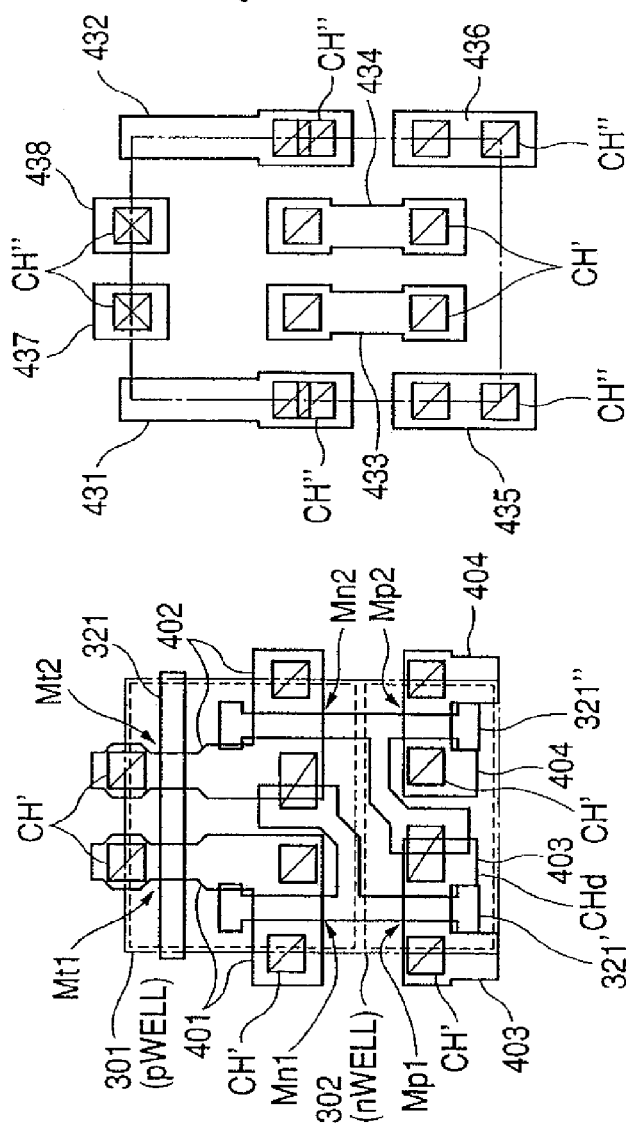
Figure 13:
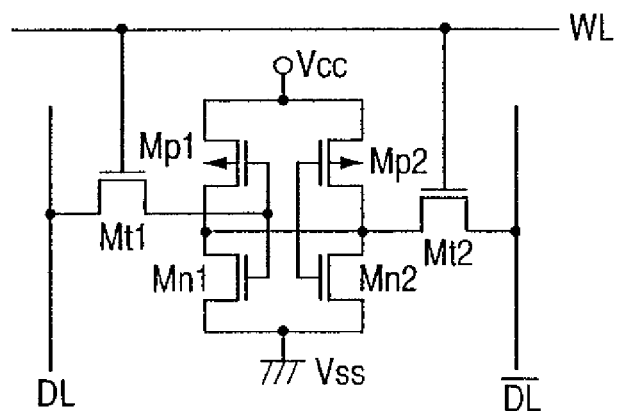
FIG. 13 is a circuit diagram showing one embodiment of a memory cell.

FIGS. 12(A) to 12(C) show examples of a cell topology for each static memory cell (SRAM) that constitutes a RAM (Random Access Memory). FIG. 13 shows a circuit configuration of the memory cell. As shown in FIG. 13, the memory cell illustrated in the present embodiment has six MISFETs. Of these, Mp1 and Mp2 are P channel MISFETs and constitute a CMOS latch circuit together with N channel MISFETs Mn1 and Mn2. Transmission N channel MISFETs Mt1 and Mt2, whose gate terminals are electrically connected to a word line WL, are electrically connected between input/output nodes of the latch circuit and data lines DL and /DL.

FIG. 12(A) shows patterns and layouts for semiconductor regions 401(n+), 402(n+), 403(p+) and 404(p+) used as source-to-drain regions of the six MISFETs constituting the memory cell, gate electrodes 321; 321' and 321" each comprised of a polysilicon layer or the like, contact holes CH', and direct contacts CH'd for respectively electrically connecting the gate electrodes 321' and 321" and the semiconductor regions 402 and 403. FIG. 12(B) illustrates patterns of connecting wires or interconnections 431 through 436 comprised of a metal layer corresponding to a first layer, for respectively connecting the source and drains of the respective MISFETs and for providing connections to power supply lines and layouts of contact holes CH". FIG. 12(C) shows patterns for a word shunt line 422, a Vss line 423 and a Vcc line 424 comprised of a metal layer (extending in the transverse direction) corresponding to a third layer, and data lines 425 and 426 (corresponding DL and /DL shown in FIG. 13) comprised of a metal layer (extending in the longitudinal direction) corresponding to a second layer, and layouts of through holes CH'".

Reference numerals 431 and 432 in FIG. 12(B) respectively indicate buffer conductive layers comprised of the metal layer corresponding to the first layer, for electrically connecting the Vss line 423 comprised of the metal layer corresponding to the third layer to the n-type semiconductor regions 401 and 402 serving as a source region of the N channel MISFETs Mn1 and Mn2. Designated at numerals 441 and 442 in FIG. 12(C) are buffer conductive layers comprised of the metal layer corresponding to the second layer, for electrically connecting the Vss line 423 comprised of the metal layer corresponding to the third layer to the n− type semiconductor regions 401 and 402 which serve as the source regions of the N channel MISFETs Mn1 and Mn2. Reference numerals 437 and 438 in FIG. 12(B) respectively indicate buffer conductive layers comprised of the metal layer corresponding to the first layer, for respectively electrically connecting the data lines 425DL and 426DL comprised of the metal layer corresponding to the second layer to the n-type semiconductor regions 401 and 402 which serve as source regions of N channel MISFETs Mt1 and Mt2.

As shown in FIGS. 12(B) and 12(C), the Vcc line 424 is electrically connected to p-type semiconductor regions defined as source regions of the P channel MISFETs Mp1 and Mp2 through buffer conductive films 427 and 428 each comprised of a metal layer corresponding to a second layer and the buffer conductive layers 435 and 436 comprised of a metal layer corresponding to a first layer. Incidentally, the third-layered metal layer and the second-layered metal layer are electrically connected to each other via the through holes CH", the second-layered metal layer and the first-layered metal layer are electrically connected to each other via the contact holes CH", and the first-layered metal layer and the semiconductor regions are electrically connected to each other through the contact holes CH'.

The word line 321 shown in FIG. 12(A) is designed so as to be formed integrally with the word line 321 shown in FIG. 10(A) and the word shunt line 422, Vss line 423 and Vcc line 424 shown in FIG. 12(C) are designed so as to be formed integrally with the word shunt line 322, Vss line 323 and Vcc line 324 shown in FIG. 10(A), respectively.

Figure 14:
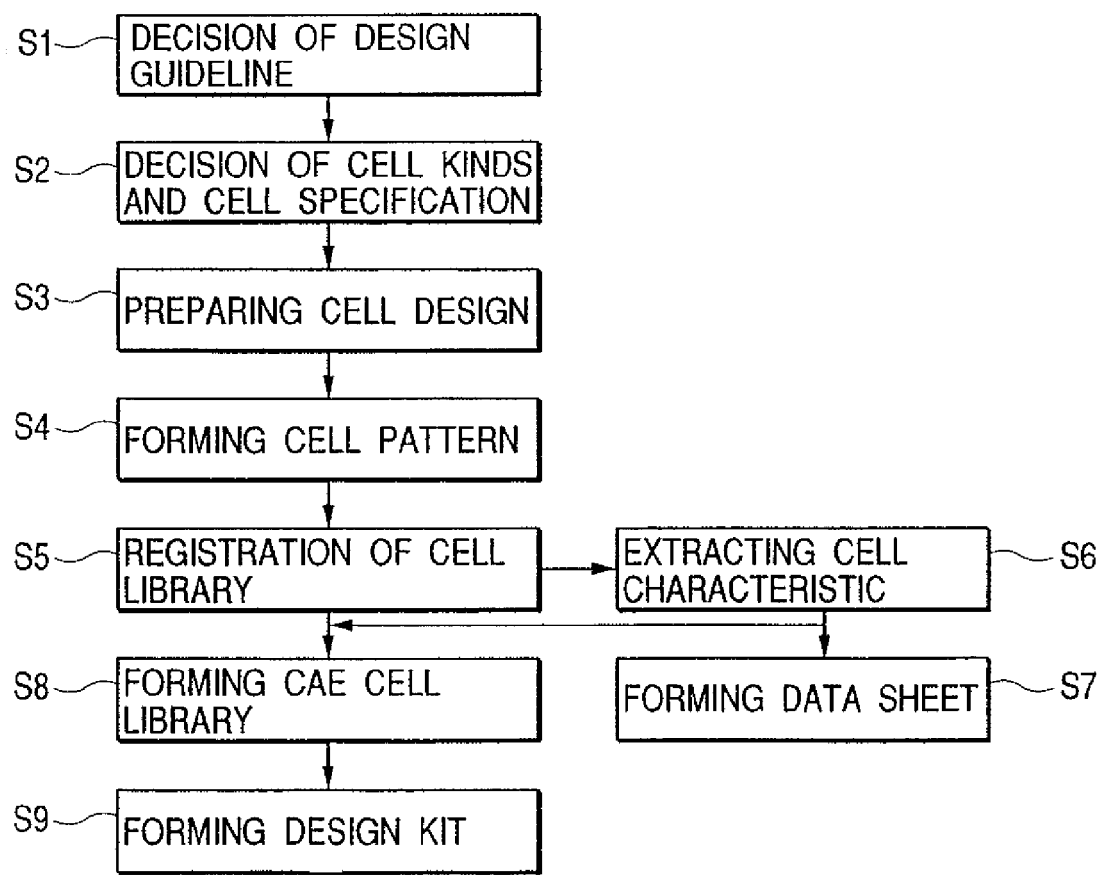
FIG. 14 is a flowchart for describing a procedure for creating a library registered with cells.

A procedure for creating a library registered with information about a plurality of cells including the inverter cells and memory power supply cells illustrated in the aforementioned embodiment will be described next in brief with reference to FIG. 14.

Upon creation of the library, a design guideline as to what kind of LSI should be offered, to which extent the source voltage should be set, etc. is first determined (Step S1). What kinds of cells should be prepared as cells constructive of an LSI, such as inverter cells, cells for logic gates such as NAND gates, memory cells constituting a RAM or the like, is next determined and the specifications of the respective cells are determined (Step S2).

Components or parts that make up each cell, such as MOSFETs, resistors, capacitors, contacts, through holes, etc. are next prepared. Further, the parts that constitute each cell to be designed, are selected, and a net list indicative of the relationships in connection between these parts and the positions or the like to provide the contacts and through holes are determined (Step S3). At this time, for example, the parts used for the same purpose are collected so as to form each object and the correspondence between the respective parts or respective elements of the object and each mask employed in a layer, i.e., a process is determined.

Figure 15:
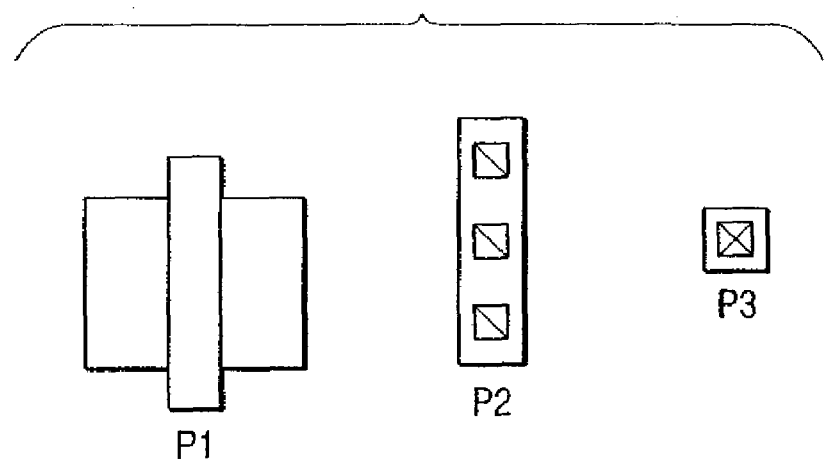
FIG. 15 is a diagram showing a portion of an inverter cell part prepared in Step ST3 of the flowchart shown in FIG. 14.

FIG. 15 shows some of parts related to an inverter cell as typical examples of the parts prepared in Step S3. In FIG. 15, P1 indicates a circuit constituent element part (MISFET) comprised of a combination of a semiconductor region used as an active region source/drain and a polysilicon layer corresponding to a gate electrode. P2 indicates a part for connecting between conductive layers, which is made up of a combination of conductive layers and through holes. P3 indicates a part for connecting between a substrate and each conductive layer, which is formed by a combination of a diffused layer and a contact hole. The cell shown in FIG. 1 is formed by selecting and placing these parts.

Consecutively, the parts and object that constitute each cell are laid out based on the net list to create or form a cell pattern (Step S4). The present invention is intended to create the corresponding cell as a common cell topology so that it can be used in both a substrate potential fixed circuit and a substrate potential variable circuit upon creation of the cell pattern as described above.

Next, pieces of information (design data) about the respective cells designed are registered in a cell library (Step S5). At this time, both the substrate potential fixed circuit cell and the substrate potential variable circuit cell formed from the common cell topology are registered in the cell library as information.

Characteristics such as voltage dependency, temperature dependency and delay times of the respective cells are extracted from the cell information designed in Step S5 referred to above (Step S6). Specifications descriptive of the feature of each cell, which are referred to as a "data sheet or databook" open to a user, are created or formed based on the extracted characteristics (Step S7).

A CAE library for logic simulation, which is offered to the user based on the cell information designed in Steps S5 and S6, is formed (Step S8). It is desirable that ones described in languages, which are respectively executable by a plurality of logic simulation tools such as Synopsys Verilog, Mentor, etc., are formed and registered in the CAE library for logic simulation. The cell data registered in Step S5 is offered to the user as a library moved on a Place & Route tool like Aquarius, a cell assembly, for example. The library of these logics and layouts is offered to the user as a design kit (Step S9).

According to the present invention, since the substrate potential fixed circuit and the substrate potential variable circuit are top-designed as the common cell topology, labor such as the extraction of the characteristics of each of the individual cells, the creation of a document such as specifications, etc. is also reduced.

Figure 16:
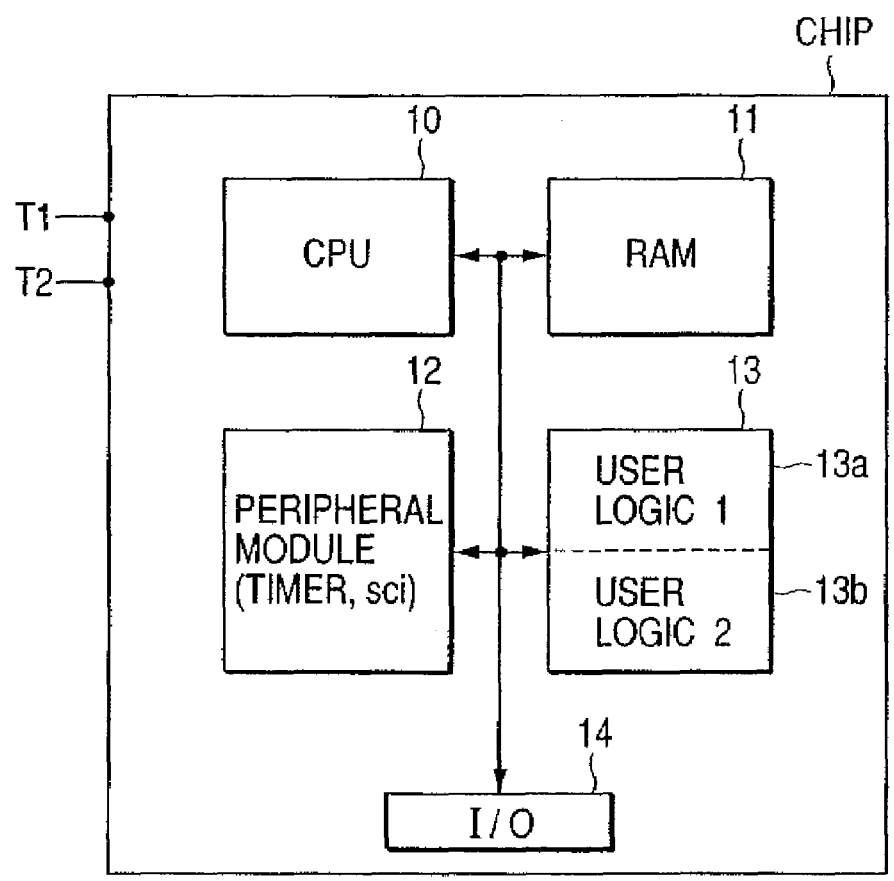
FIG. 16 is a block diagram showing an example of an ASIC configuration used as one example of a semiconductor integrated circuit device constructed using a common cell topology according to the present invention.

FIG. 16 shows an example of a configuration of a custom microcomputer illustrated as one example of an ASIC configured using a common cell topology according to the present invention.

In FIG. 16, reference numeral 10 indicates a CPU used as a control circuit, reference numeral 11 indicates a random access memory used as a memory circuit, reference numeral 12 indicates a CPU peripheral circuit module such as a timer, a serial communication interface circuit or the like, reference numeral 13 indicates a custom logic circuit unit which constitutes logics designed by users using basic circuits like inverters, flip-flops, NOR gates and NAND gates, and reference numeral 14 indicates an input/output circuit. In the present embodiment, the custom logic circuit unit 13 and the input/output circuit 14 are formed using circuit cells registered in a cell library as the aforementioned common cells. Substrate bias voltages Vbp and Vbn and switching control signals stb1 and stb2 are externally supplied through external terminals T1 and T2.

Figure 6B:
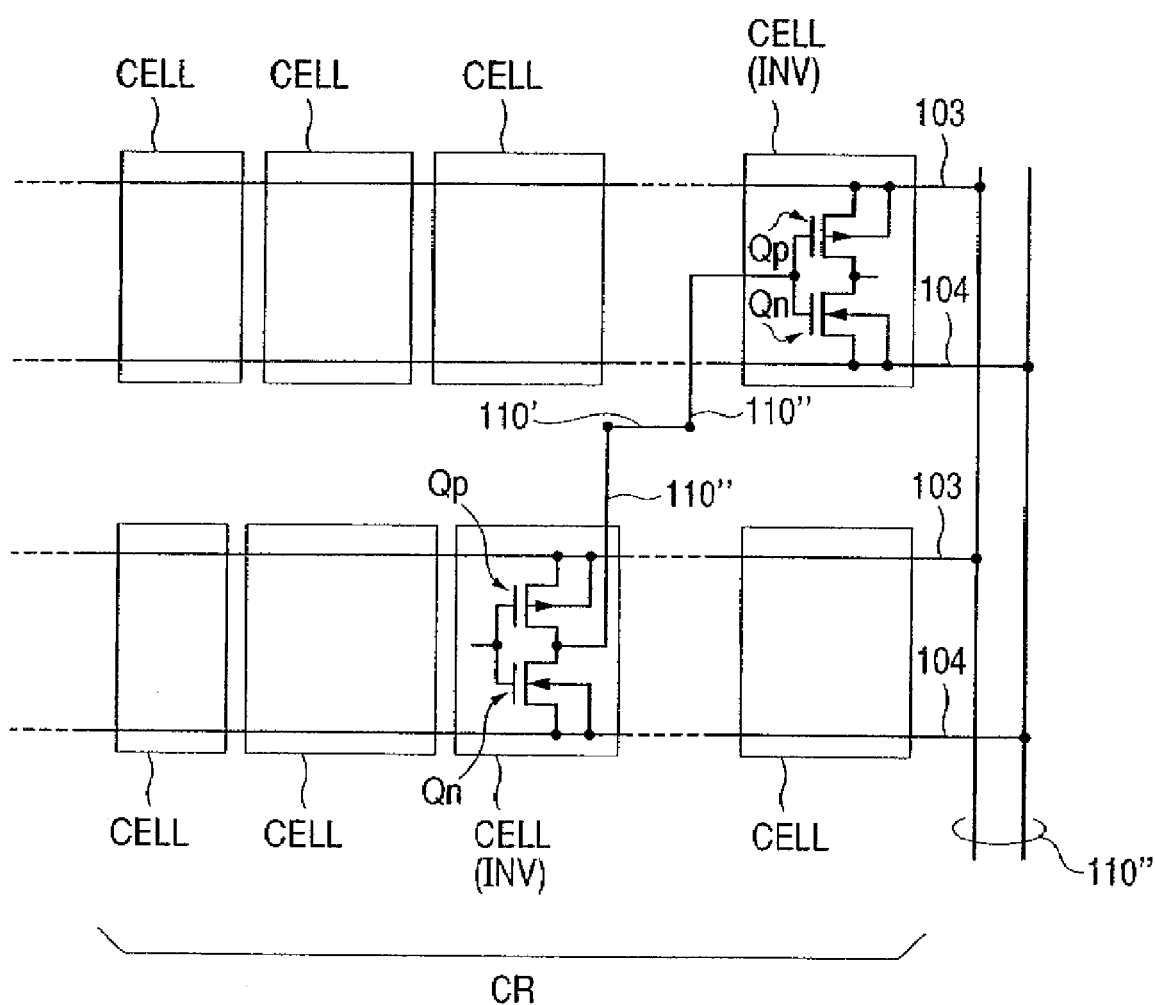
FIG. 6(B) is a plan view showing a layout pattern of a substrate potential fixed logic cell row.

Incidentally, the custom logic circuit unit 13 shown in FIG. 16 comprises a portion made up of substrate potential fixed cells and a portion made up of substrate potential variable cells, which are designated at numerals 13a and 13b respectively. The portion 13a is configured as shown in FIGS. 5(C) and 6(B) and cannot provide less power consumption. However, the portion 13a operates at high speed, and is brought into high integration and has a reduced area. On the other hand, the portion 13b is configured as shown in FIGS. 5(A), 5(B) and 6(A) and is increased more or less in area. However, the portion 13b can operate at high speed when active and achieve less power consumption at standby. By forming the less power consumption-free portion 13a using the substrate potential fixed cells and forming the portion 13b requiring less power consumption using the substrate potential variable cells in this way, the chip size can be reduced and both high-speed operation and less power consumption can be achieved.

In the aforementioned embodiment, MISFETs used as constituent elements of the custom logic circuit unit 13 comprising the substrate potential fixed cells and the substrate potential variable cells may have gate insulating films which are thin so as to form low withstand-voltage and high-speed operating devices. On the other hand, MISFETs used as devices that constitute the input/output circuit 14, may have thick gate insulating films so as to be created as high-threshold and high withstand-voltage devices. In this case, it is necessary to separately register information about circuit cells having insulating films different from each other in thickness in a library. However, since a cell pattern can be made identical to that for the circuit cells used to constitute the custom logic circuit unit, the design load is not increased very much.

Figure 17:
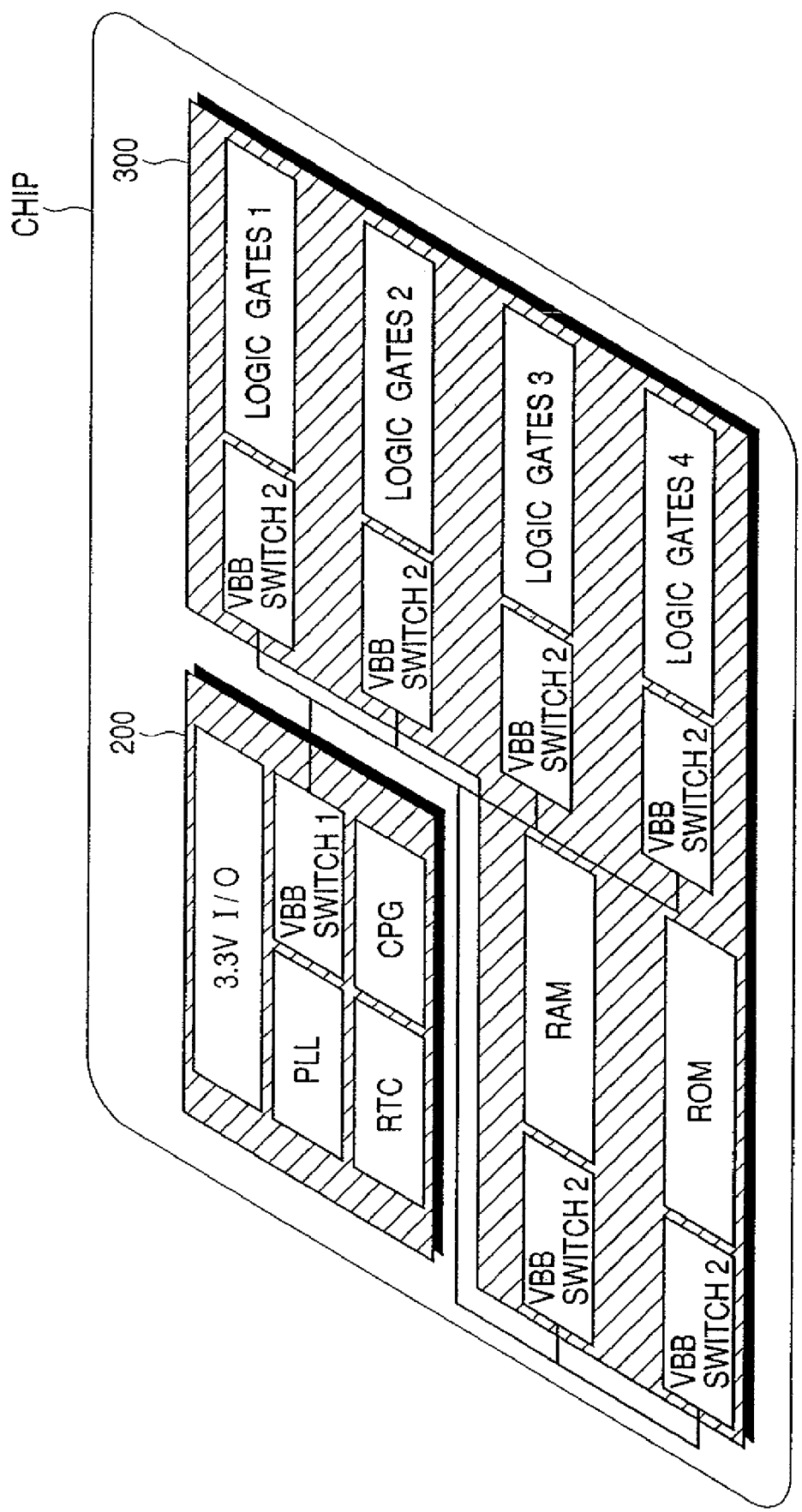
FIG. 17 is a block diagram illustrating another embodiment of an LSI which can be designed using a common cell topology according to the present invention.

FIG. 17 shows an embodiment of an LSI comprising a circuit comprised of high-withstand MISFETs each having a thick gate insulating film and a circuit comprised of low-withstand MISFETs each having a thin gate insulating film and wherein substrate potential fixed and variable circuits according to the present invention can be designed using a common cell topology.

In FIG. 17, reference numeral 200 indicates a high-voltage circuit region formed by the high-withstand MISFETs each having a thick gate insulating film. Reference numeral 300 indicates a low-voltage circuit region formed by the low-withstand MISFET each having a thin gate insulating film. In the high-voltage circuit region 200, an input/output buffer I/O for performing the input and output of a signal from and to an external device, a phase-locked loop circuit PLL, a real-time control circuit RTC, a clock pulse generator CPG and a switch circuit SW1 for performing selection of a substrate voltage to each substrate potential variable circuit to supply it thereto, etc. are formed. Further, the high-voltage circuit region 200 is configured so as to be supplied with a relatively high voltage like 3.3V as the source voltage, whereas the low-voltage circuit region 300 is configured so as to be supplied with a relatively low voltage like 1.8V as the source voltage.

The input/output buffer I/O of the circuits on the high-voltage circuit region 200 is made up of high withstand MISFETs each having a thick gate insulating film to allow the formation of a signal having a level necessary for interface with the external device. Further, the input/output buffer I/O is activated under the source voltage like 3.3V and is configured so as to have a level converting function for converting a signal having an amplitude of 3.3V to a signal having an amplitude of 1.8V suitable for a memory, a user logic circuit, etc. in the low-voltage circuit region.

It is necessary to increase the circuit operating margin from the viewpoint of a circuit function, the phase locked loop circuit PLL, real-time control circuit RTC and clock pulse generator CPG are formed within the high-voltage circuit region 200 as circuits activated by the source voltage like 3.3V. Further, the switch circuit SW1 is formed in the high-voltage circuit region 200 from the need for the formation of the switch circuit SW1 by high-withstand MOSFETs because each of the gates thereof is supplied with voltages ranging from −0.8V to 3.3V as control voltages.

In the low-voltage circuit region 300, a random access memory RAM, a read only memory ROM and logic gate circuits LGC1, LGC2, LGC3 and LGC4 used as user logic circuits are formed. A cell library is prepared so that these circuits can be formed as both the substrate potential variable and fixed circuits. Only either one of the circuits can be configured and they may be provided in a mixed form. When they are formed as substrate potential variable circuits, switch circuits SW2 used for substrate-potential switching are respectively provided adjacent to the respective circuits. These circuits are operated at a source voltage of 1.8V to provide less power consumption and perform high-speed operation. Correspondingly, these circuits are made up of low-withstand MISFETs each having a thin gate insulating film.

Although the above embodiment has described for the case in which the input/output buffer I/O has an interface having the amplitude of 3.3V, the desire for LSI activated by source voltages of 2.5V and 1.8V as the external device (LSI) is expected to increase. Therefore, an input/output buffer cell having a level converting function for converting an input signal having an amplitude of 2.5V into a signal having an amplitude of 1.8V and supplying it to an internal circuit or converting an internal signal having an amplitude of 1.8V to a signal having an amplitude of 2.5V and outputting it therefrom, or an input/output buffer cell for supplying an input signal having an amplitude of 1.8V to an internal circuit while remaining as it is at the amplitude of 1.8V, is prepared separately from the 3.3V-system input/output buffer cell illustrated in connection with the aforementioned embodiment, as the input/output buffer I/O. In this condition, a user may select it freely to design a desired voltage-system LSI or a plurality of the input/output buffer cells may be mixed together to design an LSI capable of corresponding to interfaces for plural amplitudes. As those other than the LVCMOS input/output buffer and LVTTL input/output buffer generally used in the 3.3V-system LSI illustrated in the above embodiment, high-speed transmission input/output buffer cells such as GTL, HSTL, PCI, etc. may further be prepared so that a user can suitably select them. It is needless to say that the source voltage decreases in the order of 1.5V, 1.2V and 0.9V.

Figure 18A:
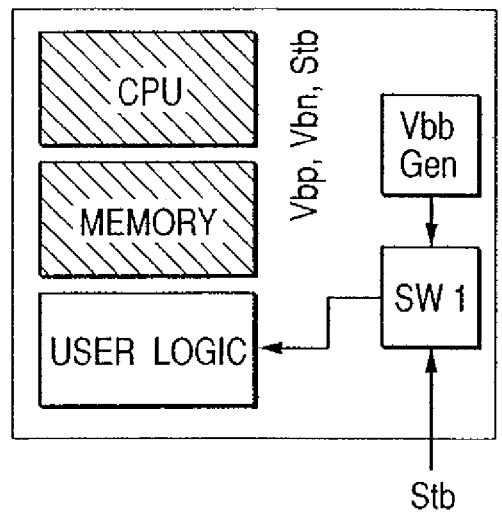
FIG. 18(A) to FIG. 18(C) are conceptual diagrams showing modifications of an LSI to which the present invention is applied.

The LSI illustrated in the embodiments shown in FIGS. 16 and 17 are constructed so as to be inputted or supplied with substrate bias voltages Vbp and Vbn and control signals stb1 and stb2 from the outside of LSI. However, a substrate potential generator BVG may be provided within an LSI chip as shown in FIG. 18(A) in place of the supply of these voltages and signals from the outside. Further, an LSI or the like in which a microprocessor is provided on the same chip, may be configured so that substrate-potential switching control signals stb1 and stb2 are also formed by an internal circuit.

Figure 18B:
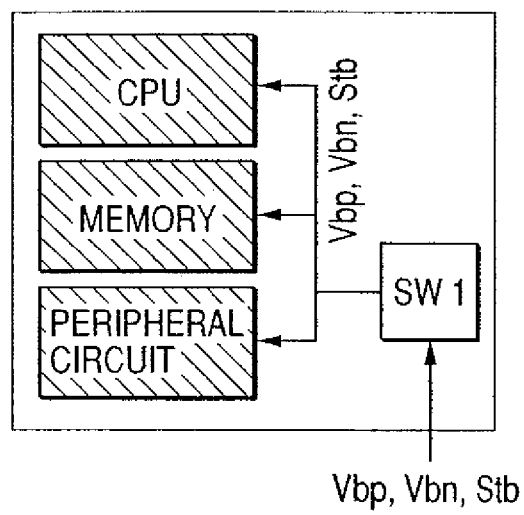
Figure 18C:
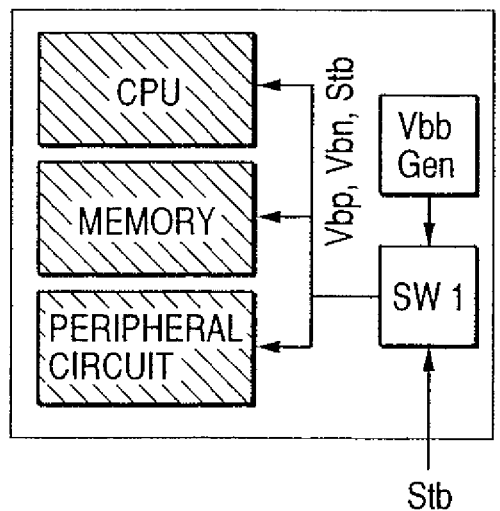

Although the aforementioned embodiment has been described for the case in which the partial circuits (user logic circuits) inside the LSI, such as the user logic circuit, the memory, etc. are formed by substrate potential variable circuits, respectively, a plurality of circuit blocks such as a CPU, a memory and a peripheral circuit lying in the LSI may be formed by the substrate potential variable circuits respectively. In this case, a common switch circuit SW1 may be configured so as to supply substrate potentials Vbp and Vbn and a switching control signal stb to a plurality of circuit blocks as shown in FIG. 18(B). Even in this case, a substrate potential generator BVG may be provided within an LSI chip as shown in FIG. 18(C).

A description will be made next of a device structure capable of implementing the partial circuits in the LSI when they are respectively formed by the substrate potential variable circuits as shown in FIG. 18(A). When the partial circuits in the LSI are respectively formed by the substrate potential variable circuits, the potential of a well region used as a base or substrate of each substrate potential variable circuit is switched upon operation and standby. Thus, when the substrate potential fixed circuit is formed within the same well region as that in which the substrate potential variable circuit is formed, the substrate potential will vary undesirably. In this case, no trouble or harm occurs in an LSI activated by a single source or power supply on the whole and whose chip entirety is brought into a standby mode. However, when the circuits activated by different source voltages are provided within the LSI and they are respectively formed by substrate potential fixed and variable circuits as shown in FIG. 17, the substrate potential fixed circuit that does not desire a variation in substrate potential, will lead to an undesirable result when the well region is commonly used.

Thus, in the LSI in which substrate potential fixed and variable circuits are provided in a mixed form, those circuits are formed on different buried or embedded well regions 131 and 132 (NiSO) as shown in FIG. 19(A), so as to achieve the separation of well potentials. The n-type buried well regions 131 and 132 can be formed by deeply ion-implanting an impurity like phosphorus into a substrate under energy higher than that used at the formation of the normal n well region 101 and p well region 102. However, the impurity densities of the buried well regions 131 and 132 may be the same level (e.g., $1 \times 10^{13}/cm3$) as those of the normal n well region 101 and p well region 102.

Since a p-type semiconductor substrate is used in the embodiment shown in FIG. 19(A), the conduction types of the buried well regions 131 and 132 are set to n types. For example, 1.8V (3.3V in a high-voltage circuit region) is applied to the p-MIS type n well region 101 on the buried well region 131 thereof in which the substrate potential fixed circuit is formed, whereas 0V is applied to the n-MIS p well region 102. On the other hand, the p-MIS type n well region 101 on the buried well region 132 with the substrate potential variable circuit formed therein is supplied with Vbp (1.8V or 3.3V) upon both operation and standby, whereas Vbn (0V or −1.5V) is applied to the n-MIS type p well region 102 upon both operation and standby. Even upon operation and standby, 3.3V and −1.5V are respectively applied to an n well region and a p well region in which MOSFETs Qp1 and Qn1 that constitute a switch circuit SW1, are formed.

The separation of the well regions in the above-described manner makes it possible to cut off noise transferred via each well from the input/output buffer I/O or PLL circuit operated at the high source voltage to the substrate potential variable circuit (user logic circuit) operated at the low source voltage. Therefore, the embodiment shown in FIG. 19 is designed in such a manner that the further separation of the well regions between the circuits operated at the same source voltage like 3.3V makes it possible to cut off noise transferred from, for example, the input/output buffer I/O to the PLL circuit to thereby prevent the circuits from malfunctioning.

Incidentally, the buried well regions NiSO are added to the object H shown in FIG. 30) by way of example to create, or form an object H' shown in FIG. 19(B) as design data, and in this condition they can be introduced or incorporated in a common layout pattern by using the object H' in place of the object H. Incidentally, it is needless to say that the buried well regions NiSO are added to the object shown in FIG. 11(C) to create an object CM' shown in FIG. 19(C) and in this condition they may be incorporated in a common layout pattern using the object CM'.

It should be noted that when the design method according to the present invention is applied to the LSI in which the substrate potential fixed and variable circuits are mixed together, it is necessary to add information about the buried well regions to the common cell topology for each substrate potential variable circuit and register buried well regions existing cells and free cells in libraries respectively.

In the present embodiment, as has been described above, the design information about the circuit cells each having a desired function are described according to the purposes and are registered in the cell library with the plurality of circuit cells for forming ASIC or the like as cell information capable of forming both substrate potential fixed and variable cells by only the deletion or addition of information about the predetermined objects. Therefore, makers can bring about an advantageous effect in that since only one kind of cell need be designed for the circuits having the same function, the load on the design and labor such as the extraction of characteristics such as delay times or the like of each designed circuit cell, the description thereof in the specifications, etc. are reduced and, in turn, the cost can be lowered.

Further, an advantageous effect can be brought about in that a semiconductor integrated circuit device wherein its chip size, power consumption and operating speed are optimized, can easily be implemented by properly using substrate potential fixed and variable cells according to the functions of the circuits used on one semiconductor chip and mixing them together in this condition.

Even when it becomes evident that upon design using the circuit cells registered in the cell library, a standby current needs to be limited to a predetermined value or less after the completion of logic simulation or reaches an estimated value or more according to the logic simulation, a designer can easily cope with it by replacing a substrate potential fixed cell with a substrate potential variable cell.

Although the invention made by the present inventors has been described specifically by reference to illustrated embodiments, the present invention is not limited to the above embodiments. It is needless to say that many changes can be made thereto within a scope not departing the substance of the invention. In the common cell topology illustrated in the embodiments, for example, whether either of substrate potential fixed and variable cells should be formed, may be designated depending on the selection of whether or not contact holes should be defined while design information about contact regions for a substrate remains held or included in cell information. In such a case, however, a layer descriptive of data for masking the contact holes for the substrate is specially defined and the presence or absence of the use of the data for the layer allows for the selection of the substrate potential fixed and variable cells.

The above-described embodiment has allowed the selection of the substrate potential fixed and variable cells by deleting the predetermined object from the common cell topology or adding it. However, the substrate potential variable cell shown in FIG. 4 (B) may be formed by using the substrate potential fixed cell shown in FIG. 4(A) as the common cell and adding the VBP and VBN lines used as the substrate potential supply lines to this cell by using a script language. Further, the aforementioned embodiment has been described for the case in which the invention is applied to a CMOS inverter cell. However, the invention can be applied to other circuit cells, such as a flip-flop circuit cell.

Further, the aforementioned embodiment has been described for the case in which the invention is applied to an LSI wherein a high reverse bias voltage is applied between the source and substrate upon standby to increase the threshold of each MOSFET so as to reduce the leakage current, whereby low power consumption is provided. However, the embodiment can be realized even as an LSI capable of performing a testing wherein a substrate bias voltage is supplied from the outside only upon testing to measure leakage current, whereby the LSI through which a current of a predetermined value or more flows, can be detected.

The above description relates to the case in which the invention, which has been made by the present inventors, is applied to an ASIC equivalent to an application field relating to its background. However, this invention is not necessarily limited in this way and can be widely used in a gate array or other semiconductor integrated circuit devices.

Effects obtained by a typical one of the inventions disclosed in the present application will be described in brief as follows:

That is, since only one kind of circuit cell need be designed for circuits having the same function upon design of a semiconductor integrated circuit device, the load on its design and labor such as the extraction of characteristics such as delay times or the like of each designed circuit cell, the description thereof in specifications, etc. are reduced and a lowering of the cost is achieved. Further a semiconductor integrated circuit device wherein its chip size, power consumption and operating speed are optimized, can be implemented by properly using substrate potential fixed and variable cells according to the functions or the like of circuit portions in which circuit cells are used on one semiconductor chip and are mixed together.

What we claim is:

1. A semiconductor integrated circuit device comprising:
   memory cells of a random access memory arranged in at least a first direction and each memory cell including a first n channel MISFET, a second n channel MISFET, a first p channel MISFET and a second p channel MISFET,
   the first n channel MISFET separately arranged, in a second direction crossing the first direction, from the first p channel MISFET in the memory cell,
   the second p channel MISFET separately arranged, in the second direction, from the second n channel MISFET in the memory cell,
   a drain region of the first n channel MISFET electrically connected to a drain region of the first p channel MISFET by a first interconnection in the memory cell, a drain region of the second n channel MISFET electrically connected to a drain region of the second p channel MISFET by a second interconnection in the memory cell, the first interconnection comprised of a same level metal layer as the second interconnection;

a first wiring line electrically connected to a source region of the first n channel MISFET and a source region of the second n channel MISFET in the memory cell, the first wiring line extending in the first direction and comprised of a higher level metal layer than first interconnections and second interconnections of the memory cells;

a second wiring line electrically coupled to the first wiring line and comprised of a different level metal layer from the first wiring line, the second wiring line extending in the second direction;

a third wiring line extending in the second direction and comprised of the same level metal layer as the second wiring line, the second wiring line and the third wiring line being spaced apart, in the first direction, from each other through the memory cells and electrically coupled to the first wiring line;

a first switch circuit including a first MISFET, and in which the second wiring line is electrically connected to one of a source region and a drain region of the first MISFET of the first switch circuit; and a second switch circuit including a second MISFET and separately arranged in the first direction from the second wiring line, and in which the third wiring line is electrically connected to one of a source region and a drain region of the second MISFET of the second switch circuit, wherein the first MISFET of the first switch circuit and the second MISFET of the second switch circuit turn off at a standby mode, and wherein the first MISFET of the first switch circuit (SW2) and the second MISFET of the second switch circuit (SW2) turn on at an active mode in which a reference voltage is applied to the first wiring line through the second wiring line and the third wiring line.

2. A semiconductor integrated circuit device according to claim 1, wherein the second wiring line is formed over a region positioned between two memory cells arranged in the first direction, and wherein the third wiring line is formed over a region positioned between two memory cells arranged in the first direction.

3. A semiconductor integrated circuit device according to claim 1, wherein the memory cells have the same cell structure and are arranged in the first direction and in the second direction to form a memory matrix, wherein the first switch circuit is arranged at an end of the memory mat, and wherein the second switch circuit is arranged at the end of the memory mat.

4. A semiconductor integrated circuit device according to claim 1, wherein the first wiring line is formed over the first interconnections and the second interconnections of the memory cells arranged in the first direction.

5. A semiconductor integrated circuit device according to claim 1, further comprising:

a processor block including a logic circuit portion and third switch circuits, the logic circuit portion including logic n channel MISFETs, and the third switch circuits including third MISFETs; and a fourth wiring line electrically coupled to source regions of the logic n channel MISFETs and to the third MISFETs of the third switch circuits, and in which the fourth wiring line is electrically connected to ones of source regions and drain regions of the third MISFETs of the third switch circuits, wherein the third MISFETs of the third switch circuits turn off at the standby mode, wherein the third MISFETs of the third switch circuits turn on at an operating mode in which a reference voltage is applied to the fourth wiring line.

6. A semiconductor integrated circuit device according to claim 1, further comprising:

an input/output circuit (I/O) including a MISFET having a relatively thick gate insulating film, wherein each of the first MISFET of the first switch circuit and the second MISFET of the second switch circuit has a relatively thin gate insulating film.

7. A semiconductor integrated circuit device according to claim 1, further comprising:

a microprocessor; and a circuit for supplying a control signal to a gate electrode of the first MISFET of the first switch circuit and a gate electrode of the second MISFET of the second switch circuit.

8. A semiconductor integrated circuit device comprising:

memory cells of a static random access memory arranged in at least a first direction and each memory cell including a first n channel MISFET, a second n channel MISFET, a first p channel MISFET and a second p channel MISFET, the first n channel MISFET separately arranged, in a second direction crossing the first direction, from the first p channel MISFET in the memory cell, the second p channel MISFET separately arranged, in the second direction, from the second n channel MISFET in the memory cell, a drain region of the first n channel MISFET electrically connected to a drain region of the first p channel MISFET by a first interconnection in the memory cell, a drain region of the second n channel MISFET electrically connected to a drain region of the second p channel MISFET by a second interconnection in the memory cell, the first interconnection comprised of a same level metal layer as the second interconnection;

a first wiring line electrically connected to a source region of the first n channel MISFET and a source region of the second n channel MISFET in the memory cell, the first wiring line extending in the first direction and comprised of a higher level metal layer than first interconnections and second interconnections of the memory cells;

a second wiring line electrically coupled to the first wiring line and comprised of a different level metal layer from the first wiring line, the second wiring line extending in the second direction;

a third wiring line extending in the second direction and comprised of the same level metal layer as the second wiring line;

a fourth wiring line extending in the second direction and comprised of the same level metal layer as the second wiring line, the second wiring line, the third wiring line and the fourth wiring line being spaced apart, in the first direction, from each other through the memory cells and electrically coupled to the first wiring line;

a first switch circuit including a first MISFET and in which the second wiring line is electrically connected to one of a source region and a drain region of the first MISFET of the first switch circuit;

a second switch circuit including a second MISFET and separately arranged, in the first direction, from the second wiring line, and in which the third wiring line is electrically connected to one of a source region and a drain region of the second MISFET of the second switch circuit; and a third switch circuit including a third MISFET and separately arranged, in the first direction, from the third wiring line, and in which the fourth wiring line is electrically connected to one of a source region and a drain region of the second MISFET of the third switch circuit, wherein the first MISFET of the first switch circuit, the second MISFET of the second switch circuit and the third MISFET of the third switch circuit turn off at a standby mode, and wherein the first MISFET of the first switch circuit, the second MISFET of the second switch circuit and the third MISFET of the third switch circuit turn on at an active mode such that a reference voltage is applied to the first wiring line through the second wiring line and the third wiring line.

9. A semiconductor integrated circuit device according to claim 8, wherein the second wiring line is formed over a region positioned between two memory cells arranged in the first direction, wherein the third wiring line is formed over a region positioned between two memory cells arranged in the first direction, and wherein the fourth wiring line is formed over a region positioned between two memory cells arranged in the first direction.

10. A semiconductor integrated circuit device according to claim 8, wherein the memory cells have the same cell structure and are arranged in the first direction and in the second direction to form a memory matrix, wherein the first switch circuit is arranged at an end of the memory mat, wherein the second switch circuit is arranged at the end of the memory mat, and wherein the third switch circuit is arranged at the end of the memory mat.

11. A semiconductor integrated circuit device according to claim 8, wherein the first wiring line is formed over the first interconnections and the second interconnections of the memory cells arranged in the first direction.

12. A semiconductor integrated circuit device according to claim 8, further comprising:

a processor block including a logic circuit portion and fourth switch circuits, the logic circuit portion including logic n channel MISFETs, the fourth switch circuits including fourth MISFETs;

a fifth wiring line electrically coupled to source regions of the logic n channel MISFETs and to the fourth MISFETs of the fourth switch circuits, and in which the fifth wiring line is electrically connected to ones of source regions and drain regions of the fourth MISFETs of the fourth switch circuits, wherein the fourth MISFETs of the fourth switch circuits turn off at the standby mode, and wherein the fourth MISFETs of the fourth switch circuits turn on at an operating mode in which a reference voltage is applied to the fifth wiring line.

13. A semiconductor integrated circuit device according to claim 8, further comprising:

an input/output circuit including a MISFET having a relatively thick gate insulating film, wherein each of the first MISFET of the first switch circuit, the second MISFET of the second switch circuit and the third MISFET of the third switch circuit has a relatively thin gate insulating film.

14. A semiconductor integrated circuit device according to claim 9, further comprising:

a microprocessor; and a circuit for supplying a control signal to a gate electrode of the first MISFET of the first switch circuit, a gate electrode of the second MISFET of the second switch circuit and a gate electrode of the third MISFET of the third switch circuit.

* * * * *